United States Patent
Shibayama et al.

(10) Patent No.: US 10,082,735 B2
(45) Date of Patent: Sep. 25, 2018

(54) SILICON-CONTAINING RESIST UNDERLAYER FILM-FORMING COMPOSITION HAVING ORGANIC GROUP HAVING ALIPHATIC POLYCYCLIC STRUCTURE

(71) Applicant: NISSAN CHEMICAL INDUSTRIES, LTD., Tokyo (JP)

(72) Inventors: Wataru Shibayama, Toyama (JP); Shuhei Shigaki, Toyama (JP); Makoto Nakajima, Toyama (JP); Satoshi Takeda, Toyama (JP); Hiroyuki Wakayama, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/325,685

(22) PCT Filed: Jul. 10, 2015

(86) PCT No.: PCT/JP2015/069927
§ 371 (c)(1),
(2) Date: Jan. 11, 2017

(87) PCT Pub. No.: WO2016/009965
PCT Pub. Date: Jan. 21, 2016

(65) Prior Publication Data
US 2017/0153549 A1 Jun. 1, 2017

(30) Foreign Application Priority Data
Jul. 15, 2014 (JP) .................................. 2014-145212

(51) Int. Cl.
| | | |
|---|---|---|
| *G03F 7/075* | (2006.01) | |
| *G03F 7/11* | (2006.01) | |
| *G03F 7/40* | (2006.01) | |
| *C08L 83/04* | (2006.01) | |
| *C09D 183/04* | (2006.01) | |
| *C08G 77/04* | (2006.01) | |
| *C09D 183/16* | (2006.01) | |
| *G03F 7/16* | (2006.01) | |
| *G03F 7/20* | (2006.01) | |
| *G03F 7/30* | (2006.01) | |
| *H01L 21/027* | (2006.01) | |

(52) U.S. Cl.
CPC ............... *G03F 7/11* (2013.01); *C08G 77/04* (2013.01); *C08L 83/04* (2013.01); *C09D 183/04* (2013.01); *C09D 183/16* (2013.01); *G03F 7/0752* (2013.01); *G03F 7/16* (2013.01); *G03F 7/20* (2013.01); *G03F 7/30* (2013.01); *G03F 7/40* (2013.01); *H01L 21/0271* (2013.01); *H01L 21/0273* (2013.01)

(58) Field of Classification Search
CPC .... H01L 21/0274; C08L 83/04; C09D 183/04
USPC ... 430/270.1, 271.1, 273.1, 282.1, 322, 325, 430/329, 330, 331; 438/703
See application file for complete search history.

(56) References Cited

U.S. PATENT DOCUMENTS

| | | | | |
|---|---|---|---|---|
| 9,389,509 | B2 * | 7/2016 | Huang | G03F 7/0757 |
| 2009/0011372 | A1 * | 1/2009 | Ogihara | C08L 83/04 430/323 |
| 2009/0136869 | A1 * | 5/2009 | Ogihara | C08G 77/56 430/270.1 |
| 2012/0070994 | A1 * | 3/2012 | Kanno | G03F 7/0752 438/703 |
| 2013/0183830 | A1 * | 7/2013 | Takeda | H01L 21/0332 438/703 |
| 2013/0224957 | A1 * | 8/2013 | Kanno | G03F 7/11 438/703 |
| 2014/0093825 | A1 * | 4/2014 | Ogihara | G03F 7/0035 430/323 |

(Continued)

FOREIGN PATENT DOCUMENTS

| | | |
|---|---|---|
| JP | 2009-030006 A | 2/2009 |
| JP | 2009-126940 A | 6/2009 |

(Continued)

OTHER PUBLICATIONS

McGraw-Hill Dictionary of Scientific and Technical Terms, 3rd Edition, The Nikkan Kogyo Shinbun, Ltd. Isao Mizoguchi, Mar. 18, 1997, p. 747.

(Continued)

*Primary Examiner* — Amanda C. Walke
(74) *Attorney, Agent, or Firm* — Oliff PLC

(57) ABSTRACT

A resist underlayer film-forming composition for lithography having an aliphatic polycyclic structure including, as a silane, a hydrolyzable silane, a hydrolysis product thereof, a hydrolysis-condensation product thereof, or a combination thereof, in which the aliphatic polycyclic structure is a structure which a hydrolyzable silane of Formula (1):

$$R^1_a R^2_b Si(R^3)_{4-(a+b)} \qquad \text{Formula (1)}$$

(where $R^1$ is an organic group having an aliphatic polycyclic structure and bonded to a Si atom through a Si—C bond; $R^3$ is an ethoxy group; a is an integer of 1; b is an integer of 0 to 2; and a+b is an integer of 1 to 3) has, or a structure included in a compound added as an aliphatic polycyclic compound, an aliphatic polycyclic dicarboxylic acid, or an aliphatic polycyclic dicarboxylic acid anhydride, each optionally having a double bond, a hydroxy group, or an epoxy group.

11 Claims, No Drawings

(56) References Cited

U.S. PATENT DOCUMENTS

2015/0316849 A1* 11/2015 Kanno .............. H01L 21/02126
                                                            438/694

FOREIGN PATENT DOCUMENTS

| JP | 2013-166812 A | 8/2013 |
| JP | 2013-167669 A | 8/2013 |
| WO | 2009/044742 A1 | 4/2009 |
| WO | 2010/140551 A1 | 12/2010 |
| WO | 2012/039337 A1 | 3/2012 |

OTHER PUBLICATIONS

Sep. 8, 2015 International Search Report issued in International Patent Application No. PCT/JP2015/069927.
Sep. 8, 2015 Written Opinion of the International Searching Authority issued in International Patent Application No. PCT/JP2015/069927.

* cited by examiner

SILICON-CONTAINING RESIST UNDERLAYER FILM-FORMING COMPOSITION HAVING ORGANIC GROUP HAVING ALIPHATIC POLYCYCLIC STRUCTURE

TECHNICAL FIELD

The present invention relates to a composition for forming an underlayer film between a substrate and a resist (such as photoresist or electron beam resist) for use in the manufacture of semiconductor devices. Specifically, the present invention relates to a resist underlayer film-forming composition for lithography for forming an underlayer film used as a layer under a photoresist in a lithography process for the manufacture of semiconductor devices. Furthermore, the present invention relates to a method for forming a resist pattern using the underlayer film-forming composition.

BACKGROUND ART

In the manufacture of semiconductor devices, fine processing by lithography using photoresists has been conventionally performed. The fine processing is a processing method including: forming a photoresist thin film on a semiconductor substrate such as a silicon wafer; irradiating the thin film with an active ray such as ultraviolet ray through a mask pattern having a semiconductor device pattern depicted therein; carrying out development; and etching the substrate with the obtained photoresist pattern as a protective film, thereby forming fine projections and depressions corresponding to the pattern, on the surface of the substrate. However, with the higher integration of semiconductor devices in recent years, an active ray to be used tends to have a shorter wavelength, namely, shift from KrF excimer laser (248 nm) to ArF excimer laser (193 nm). Accordingly, the influence of reflection of the active ray on a semiconductor substrate has become a serious problem.

A film known as a hard mask containing metal elements, such as silicon and titanium, has been used as an underlayer film between a semiconductor substrate and a photoresist. In this case, the photoresist and the hard mask are significantly different in components, and the rates to remove these by dry etching are greatly dependent on the types of gas used for dry etching. Therefore, the appropriate selection of a gas type allows the hard mask to be removed by dry etching without a large reduction in the film thickness of the photoresist. Thus, in the manufacture of semiconductor devices in recent years, a resist underlayer film has been increasingly disposed between a semiconductor substrate and a photoresist to achieve various effects such as an anti-reflection effect. Compositions for photoresist underlayer films have been studied, but, because of the diversity of characteristics demanded of the compositions, development of novel materials for photoresist underlayer films has been desired.

An invention has been described which provides a silicon-containing resist underlayer film-forming composition containing a polysiloxane having an organic group having a hydroxy or carboxy group, in which the organic group is, for example, norbornene, which has an aliphatic polycyclic structure (refer to Patent Document 1).

An invention has been described which provides a silicon-containing resist underlayer film-forming composition containing a polysiloxane having an organic group having a hydroxy or carboxy group substituted by an acid unstable group, in which the organic group has an aliphatic polycyclic structure, for example, norbornene (refer to Patent Document 2).

PRIOR ART DOCUMENTS

Patent Documents

Patent Document 1: Japanese Unexamined Patent Application Publication No. 2013-166812 (JP 2013-166812 A)
Patent Document 2: Japanese Unexamined Patent Application Publication No. 2013-167669 (JP 2013-167669 A)

SUMMARY OF THE INVENTION

Problem to be Solved by the Invention

It is an object of the present invention to provide a resist underlayer film-forming composition for lithography for use in the manufacture of semiconductor devices. Specifically, it is an object of the present invention to provide a resist underlayer film-forming composition for lithography for forming a resist underlayer film that can be used as a hard mask. Furthermore, it is an object of the present invention to provide a resist underlayer film-forming composition for lithography for forming a resist underlayer film that can be used as an anti-reflective coating. Furthermore, it is an object of the present invention to provide a resist underlayer film for lithography which does not intermix with a resist and whose dry etching rate is higher than that of the resist, and to provide a resist underlayer film-forming composition for forming the underlayer film.

In particular, it is an object of the present invention to provide a resist underlayer film-forming composition for forming a resist underlayer film that allows an excellent resist pattern shape to be formed when a resist as an upper layer is exposed to light and developed using an alkaline developing solution or an organic solvent, and that allows a rectangular resist pattern to be transferred to an underlayer by subsequent dry etching.

Means for Solving the Problem

The present invention provides:
as a first aspect, a resist underlayer film-forming composition for lithography having an aliphatic polycyclic structure, the composition comprising, as a silane, a hydrolyzable silane, a hydrolysis product thereof, a hydrolysis-condensation product thereof, or a combination thereof, in which the aliphatic polycyclic structure is a structure which a hydrolyzable silane of Formula (1):

$$R^1_a R^2_b Si(R^3)_{4-(a+b)} \qquad \text{Formula (1)}$$

(where $R^1$ is an organic group having an aliphatic polycyclic structure and bonded to a Si atom through a Si—C bond; $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond; $R^3$ is an ethoxy group; a is an integer of 1; b is an integer of 0 to 2; and a+b is an integer of 1 to 3) has, or a structure included in a compound added as an aliphatic polycyclic compound, an aliphatic polycyclic dicarboxylic acid, or an aliphatic polycyclic dicarboxylic acid anhydride, each optionally having a double bond, a hydroxy group, or an epoxy group;

as a second aspect, the resist underlayer film-forming composition according to the first aspect, in which $R^1$ in Formula (1) is an optionally substituted norbornene, an optionally substituted norbornane, a cyclic aliphatic group containing a heteroatom, or an organic group including an arbitrary combination thereof;

as a third aspect, the resist underlayer film-forming composition according to the second aspect, in which a substituent of $R^1$ in Formula (1) is a carboxy group, a carboxylic acid anhydride group, a carboxylic acid ester group, a hydroxy group, an alkoxy group, or an oxygen atom;

as a fourth aspect, the resist underlayer film-forming composition according to the first aspect or the second aspect, in which the hydrolyzable silane is a combination of the hydrolyzable silane of Formula (1) and another hydrolyzable silane, the other hydrolyzable silane being at least one hydrolyzable silane selected from the group consisting of a hydrolyzable silane of Formula (2):

$$R^4{}_c Si(R^5)_{4-c} \quad \text{Formula (2)}$$

(where $R^4$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond; $R^5$ is an alkoxy group, an acyloxy group, or a halogen group; and c is an integer of 0 to 3) and a hydrolyzable silane of Formula (3):

$$[R^6{}_d Si(R^7)_{3-d}]_2 Y_e \quad \text{Formula (3)}$$

(where $R^6$ is an alkyl group and bonded to a silicon atom through a Si—C bond; $R^7$ is an alkoxy group, an acyloxy group, or a halogen group; Y is an alkylene group or an arylene group; d is an integer of 0 or 1; and e is an integer of 0 or 1);

as a fifth aspect, a resist underlayer film-forming composition comprising, as a polymer, a hydrolysis-condensation product of a hydrolyzable silane formed of a combination of the hydrolyzable silane of Formula (1) according to the first aspect and the hydrolyzable silane of Formula (2) according to the fourth aspect;

as a sixth aspect, the resist underlayer film-forming composition according to any one of the first aspect to the fifth aspect, the composition further comprising an acid as a hydrolysis catalyst;

as a seventh aspect, the resist underlayer film-forming composition according to any one of the first aspect to the sixth aspect, the composition further comprising water;

as an eighth aspect, a resist underlayer film obtained by applying the resist underlayer film-forming composition according to any one of the first aspect to the seventh aspect onto a semiconductor substrate and baking the applied resist underlayer film-forming composition;

as a ninth aspect, a method for manufacturing a semiconductor device, the method comprising the steps of: applying the resist underlayer film-forming composition according to any one of the first aspect to the seventh aspect onto a semiconductor substrate, and baking to form a resist underlayer film; applying a resist composition onto the underlayer film to form a resist film; exposing the resist film to light; developing the resist film after the exposure to obtain a resist pattern; etching the resist underlayer film using the resist pattern; and processing the semiconductor substrate using the patterned resist and the patterned resist underlayer film; and as a tenth aspect, a method for manufacturing a semiconductor device, the method comprising the steps of: forming an organic underlayer film on a semiconductor substrate; applying the resist underlayer film-forming composition according to any one of the first aspect to the seventh aspect onto the organic underlayer film, and baking to form a resist underlayer film; applying a resist composition onto the resist underlayer film to form a resist film; exposing the resist film to light; developing the resist film after the exposure to obtain a resist pattern; etching the resist underlayer film using the resist pattern; etching the organic underlayer film using the patterned resist underlayer film; and processing the semiconductor substrate using the patterned organic underlayer film.

Effects of the Invention

The resist underlayer film-forming composition of the present invention is configured according to the above-mentioned aspects, whereby the change in film thickness after the application of the composition is smaller, and the resulting resist underlayer film is highly stable.

In the present invention, a resist underlayer film is formed on a substrate by application, or is formed via an organic underlayer film on a substrate by application onto the organic underlayer film, and then, a resist film (for example, photoresist or electron beam resist) is formed on the resist underlayer film. Then, a resist pattern is formed by exposure and development. Using the resist pattern, the resist underlayer film is dry-etched to perform the transfer of the pattern, and the substrate is processed using the pattern, or the organic underlayer film is etched to perform the transfer of the pattern, and the substrate is processed using the organic underlayer film.

In the formation of a fine pattern, the film thickness of a resist tends to be made thinner for the purpose of preventing pattern collapse. Due to such a thinner resist film, the etching rate of dry etching for transferring a pattern to a film present under the resist film needs to be higher than the etching rate of the upper layer film in order to perform the transfer of the pattern. In the present invention, a resist underlayer film (containing an inorganic silicon-based compound) including the composition of the present invention is coated on a substrate via an organic underlayer film or not via an organic underlayer film, and a resist film (an organic resist film) is coated thereon in this order. Depending on a selected etching gas, a film of an organic component and a film of an inorganic component considerably differ in dry etching rate. With the use of an oxygen-based gas, a film of an organic component is dry-etched at a higher rate. In contrast, with the use of a halogen-containing gas, a film of an inorganic component is dry-etched at a higher rate.

For example, a resist pattern is formed, and a resist underlayer film that is formed using the composition of the present invention and present under the resist pattern is dry-etched using a halogen-containing gas to transfer the pattern to the resist underlayer film. Using the pattern transferred to the resist underlayer film, a substrate is processed using a halogen-containing gas. Alternatively, using the resist underlayer film to which the pattern is transferred, an organic underlayer film present under the resist underlayer film is dry-etched using an oxygen-based gas to transfer the pattern to the organic underlayer film. Using the organic underlayer film to which the pattern is transferred, a substrate is processed using a halogen-containing gas.

In the present invention, the resist underlayer film functions as a hard mask, and, in any developing process in any generation lithography, the acidity of the underlayer film needs to be adjusted to control the shape of a resist.

In particular, a silicon-containing resist underlayer film having an organic group having a norbornene skeleton or a norbornane skeleton can undergo ultrafine patterning and exhibits good adhesion at each of the exposure wavelengths of ArF, EUV, and EB.

MODES FOR CARRYING OUT THE INVENTION

The present invention provides a resist underlayer film-forming composition for lithography having an aliphatic polycyclic structure, the composition comprising, as a silane, a hydrolyzable silane, a hydrolysis product thereof, a hydrolysis-condensation product thereof, or a combination thereof, in which the aliphatic polycyclic structure is a structure which the hydrolyzable silane of Formula (1) has, or a structure included in a compound added as an aliphatic polycyclic compound, an aliphatic polycyclic dicarboxylic acid, or an aliphatic polycyclic dicarboxylic acid anhydride, each optionally having a double bond, a hydroxy group, or an epoxy group.

In Formula (1), $R^1$ is an organic group having an aliphatic polycyclic structure and bonded to a Si atom through a Si—C bond. $R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond. $R^3$ is an ethoxy group, a is an integer of 1, b is an integer of 0 to 2, and a+b is an integer of 1 to 3.

In the organic group as $R^1$ which has an aliphatic polycyclic structure and is bonded to a Si atom through a Si—C bond, examples of the aliphatic polycyclic structure include polycyclic structures, such as an adamantane ring and a norbornene ring.

$R^1$ in Formula (1) is preferably an optionally substituted norbornene, an optionally substituted norbornane, a cyclic aliphatic group containing a heteroatom, or an organic group including an arbitrary combination thereof. The organic group including the norbornene or norbornane may be such that the norbornene ring and the norbornane ring are directly bonded to a Si atom, or may be such that the norbornene ring or the norbornane ring is bonded to a Si atom via, for example, an alkylene group. Examples of the alkylene group include alkylene groups derived from alkyl groups illustrated below.

The substituent of $R^1$ of Formula (1) may be, for example, a carboxy group, a carboxylic acid anhydride group, a carboxylic acid ester group, a hydroxy group, an alkoxy group, or an oxygen atom.

In the total silanes, the silane of Formula (1) may be used in a range of 50% by mole or less, 0.05% by mole to 50% by mole, 0.1% by mole to 50% by mole, or 0.1% by mole to 40% by mole.

The resist underlayer film-forming composition of the present invention includes a hydrolyzable silane of Formula (1), or a hydrolyzable silane of Formula (1) and another hydrolyzable silane (for example, a hydrolyzable silane of Formula (2)), a hydrolysis product thereof, or a hydrolysis-condensation product thereof, and a solvent. Furthermore, the resist underlayer film-forming composition may include an acid, water, alcohol, a curing catalyst, an acid generator, other organic polymers, a light-absorbing compound, and a surfactant, as optional components.

The resist underlayer film forming composition of the present invention has a solid content of, for example, 0.1% by mass to 50% by mass, 0.1% by mass to 30% by mass, or 0.1% by mass to 25% by mass. Here, the solid content means a content obtained by subtracting a solvent component from all components of the resist underlayer film-forming composition.

The ratio of the hydrolyzable silane, the hydrolysis product thereof, and the hydrolysis-condensation product thereof in the solid content is 20% by mass or more, for example, 50% by mass to 100% by mass, 60% by mass to 99% by mass, or 70% by mass to 99% by mass.

Furthermore, the above-mentioned hydrolyzable silane, the hydrolysis product thereof, and the hydrolysis-condensation product thereof may be used in the form of a mixture thereof. A condensation product obtained by hydrolyzing a hydrolyzable silane and condensing the resulting hydrolysis product may be used. Furthermore, a mixture may be used, obtained by mixing a hydrolysis-condensation product with a silane compound and a partial hydrolysis product in which hydrolysis to obtain the hydrolysis-condensation product has not been perfectly completed. This condensation product is a polymer having a polysiloxane structure. Examples of this polysiloxane include a hydrolysis-condensation product of the hydrolyzable silane of Formula (1), or the hydrolyzable silane of Formula (1) and another hydrolyzable silane (for example, a hydrolyzable silane of Formula (2)). Furthermore, the hydrolyzable silane of Formula (1) or a hydrolyzable silane formed of the hydrolyzable silane of Formula (1) and the hydrolyzable silane of Formula (2) may be added to a hydrolysis-condensation product (polysiloxane) of a hydrolysis product of the hydrolyzable silane of Formula (1) or a hydrolyzable silane formed of a combination of the hydrolyzable silane of Formula (1) and the hydrolyzable silane of Formula (2).

The above-mentioned alkyl group may be a linear or branched $C_{1-10}$ alkyl group, and examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

Furthermore, a cyclic alkyl group may be used, and examples of the cyclic $C_{1-10}$ alkyl group include cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

The alkenyl group may be, for example, a $C_{2-10}$ alkenyl group, and examples of the alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

The aryl group may be, for example, a $C_{6-20}$ aryl group, and examples of the aryl group include phenyl group, o-methylphenyl group, m-methylphenyl group, p-methylphenyl group, o-chlorophenyl group, m-chlorophenyl group, p-chlorophenyl group, o-fluorophenyl group, p-mercaptophenyl group, o-methoxyphenyl group, p-methoxyphenyl group, p-aminophenyl group, p-cyanophenyl group, α-naphthyl group, β-naphthyl group, o-biphenylyl group, m-biphenylyl group, p-biphenylyl group, 1-anthryl group, 2-anthryl group, 9-anthryl group, 1-phenanthryl group, 2-phenanthryl group, 3-phenanthryl group, 4-phenanthryl group, and 9-phenanthryl group.

Examples of the organic group having an epoxy group include glycidoxymethyl, glycidoxyethyl, glycidoxypropyl, glycidoxybutyl, and epoxycyclohexyl.

Examples of the organic group having an acryloyl group include acryloylmethyl, acryloylethyl, and acryloylpropyl.

Examples of the organic group having a methacryloyl group include methacryloylmethyl, methacryloylethyl, and methacryloylpropyl.

Examples of the organic group having a mercapto group include ethylmercapto group, butylmercapto group, hexylmercapto group, and octylmercapto group.

Examples of the organic group having a cyano group include cyanoethyl group and cyanopropyl group.

The above-mentioned alkoxy group may be, for example, an alkoxy group having a linear, branched, or cyclic $C_{1-20}$ alkyl portion. Examples of the alkoxy group include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group; and examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

The above-mentioned acyloxy group may be, for example, a $C_{2-20}$ acyloxy group, and examples of the acyloxy group include methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, i-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Examples of the above-mentioned halogen group include a fluorine atom, a chlorine atom, a bromine atom, and an iodine atom.

Examples of the hydrolyzable silane of Formula (1) are as follows.

Formula (1-1)

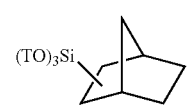

Formula (1-2)

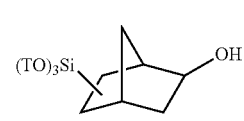

Formula (1-3)

Formula (1-4)

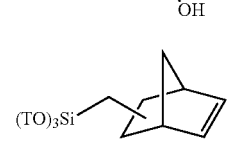

Formula (1-5)

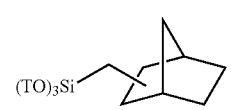

Formula (1-6)

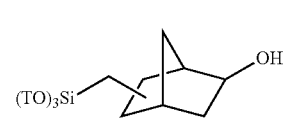

Formula (1-7)

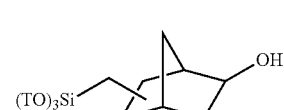

Formula (1-8)

Formula (1-9)

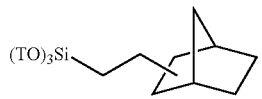

Formula (1-10)

Formula (1-11)

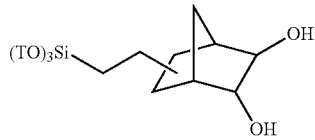

Formula (1-12)

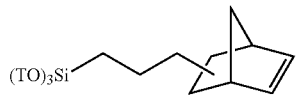

Formula (1-13)

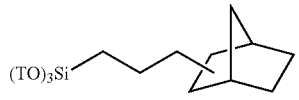

Formula (1-14)

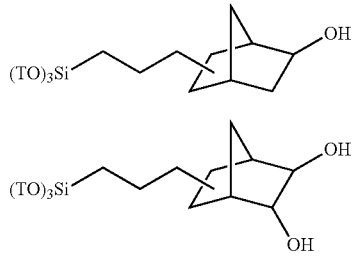

Formula (1-15)

Formula (1-16)

Formula (1-17)

Formula (1-18)

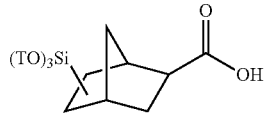

Formula (1-19)

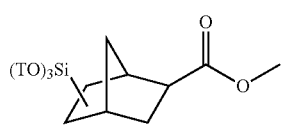

Formula (1-20)

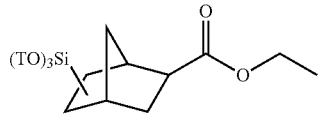

Formula (1-21)

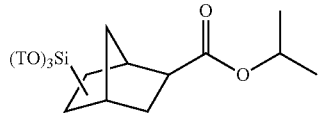

Formula (1-22)

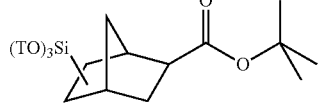

Formula (1-23)
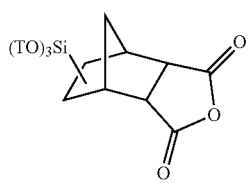
Formula (1-24)
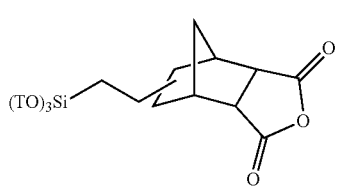
Formula (1-25)
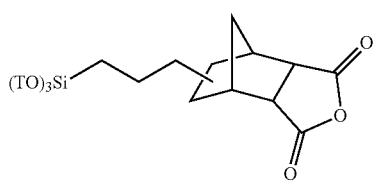
Formula (1-26)
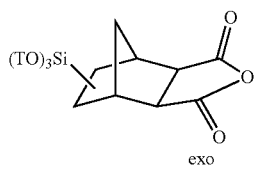
exo
Formula (1-27)
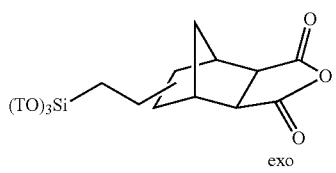
exo
Formula (1-28)
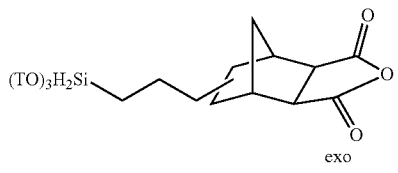
exo
Formula (1-29)
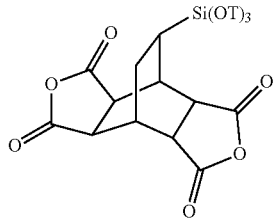
Formula (1-30)
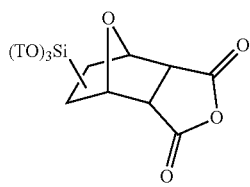
Formula (1-31)
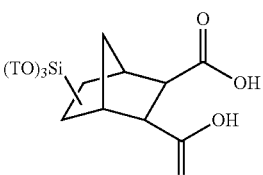
Formula (1-32)
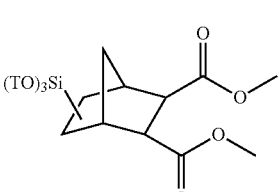
Formula (1-23)
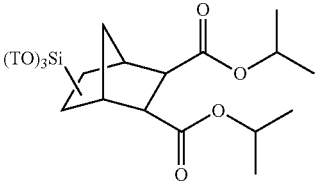
Formula (1-34)
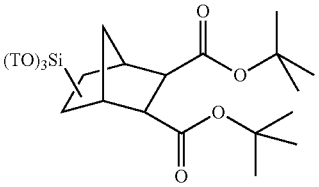
Formula (1-35)
Formula (1-36)
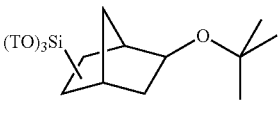
Formula (1-37)
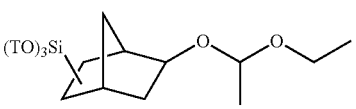
Formula (1-38)
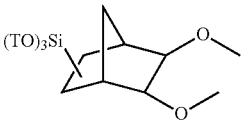
Formula (1-39)
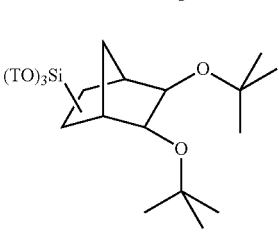

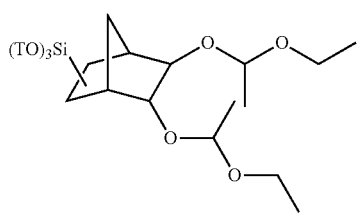
Formula (1-40)
Formula (1-41)
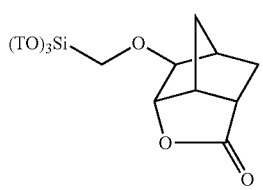
Formula (1-42)
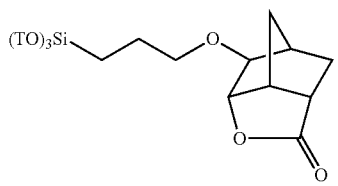
Formula (1-43)
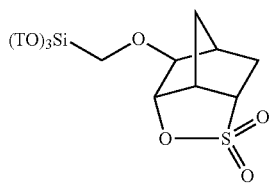
Formula (1-44)
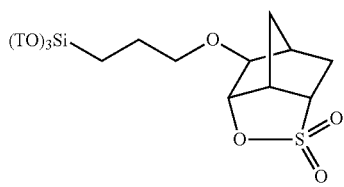
Formula (1-45)
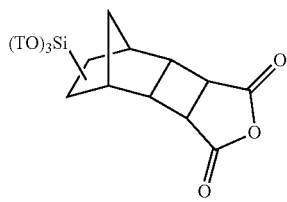
Formula (1-46)
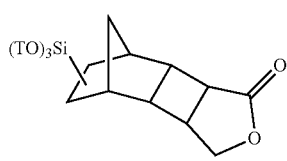
Formula (1-47)
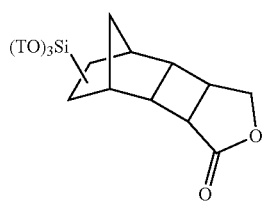
Formula (1-48)
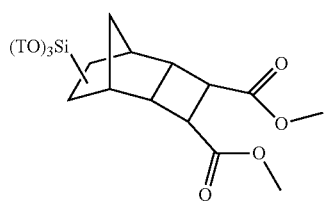
Formula (1-49)
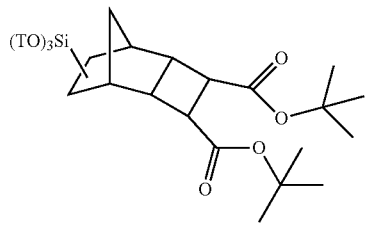
Formula (1-50)
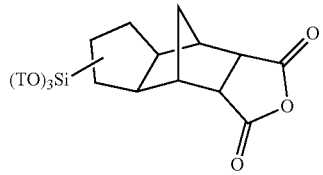
Formula (1-51)
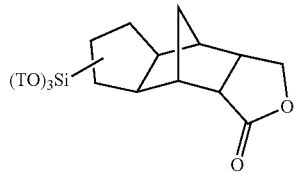
Formula (1-52)
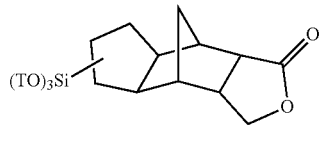
Formula (1-53)
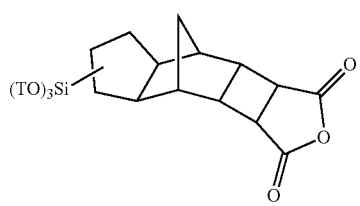
Formula (1-54)
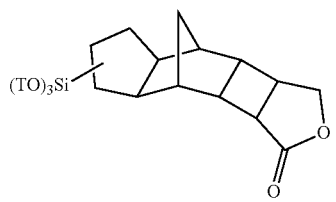
Formula (1-55)

Formula (1-56)
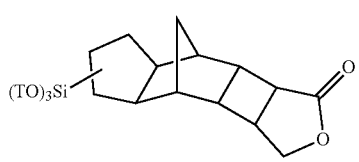
Formula (1-57)
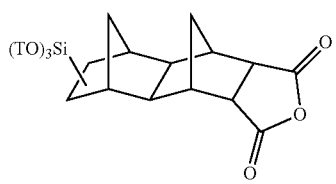
Formula (1-58)
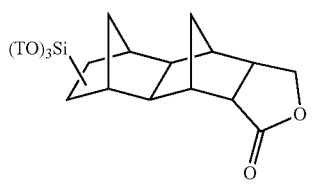
Formula (1-59)
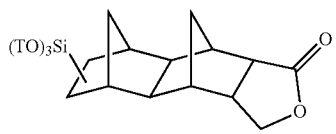
Formula (1-60)
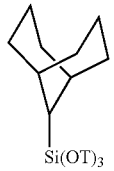
Formula (1-61)
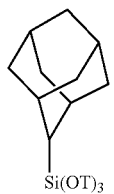
Formula (1-62)
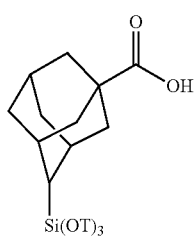
Formula (1-63)
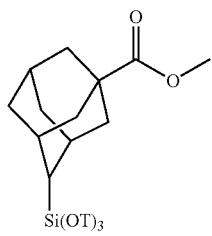
Formula (1-64)
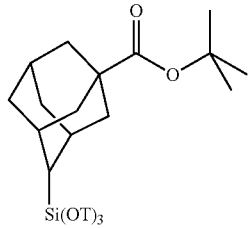
Formula (1-65)
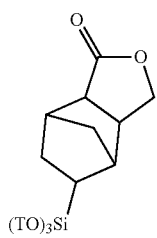
Formula (1-66)
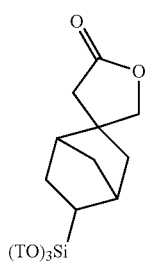
Formula (1-67)
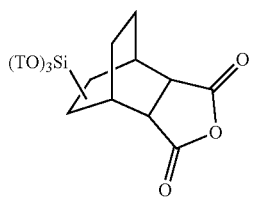
Formula (1-68)
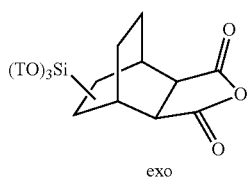
exo
Formula (1-69)
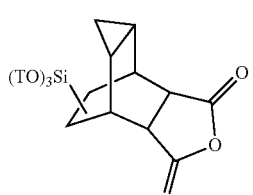
In the formulae above, T is an ethyl group.

Formula (1-70)
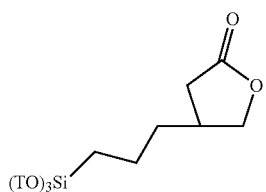
Formula (1-71)
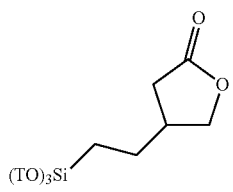
Formula (1-72)
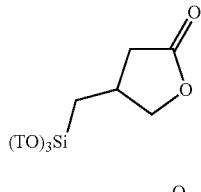
Formula (1-73)
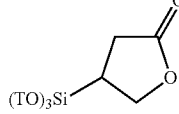
Formula (1-74)
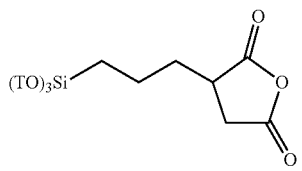
Formula (1-75)
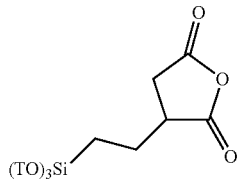
Formula (1-76)
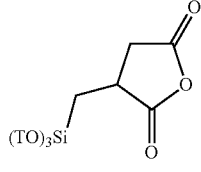
Formula (1-77)
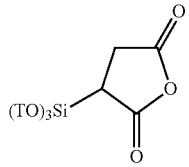
Formula (1-78)
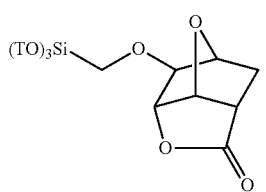
Formula (1-79)
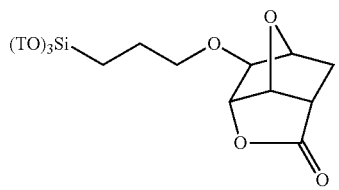
Formula (1-80)
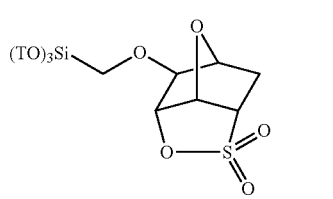
Formula (1-81)
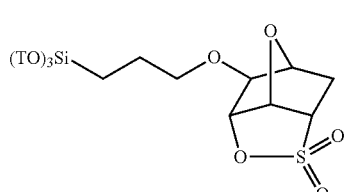
Formula (1-82)
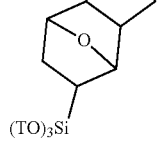
Formula (1-83)
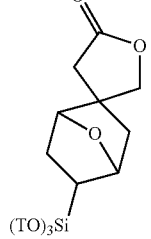
Formula (1-84)
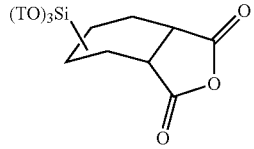
Formula (1-85)
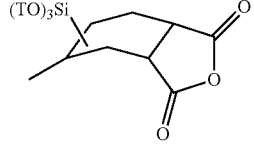
Formula (1-86)
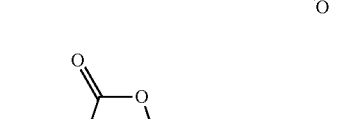

Formula (1-87)
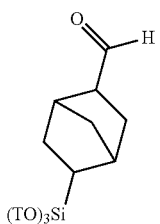
Formula (1-94)
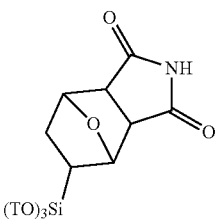
Formula (1-88)
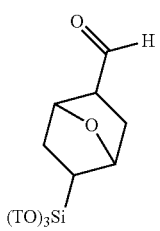
Formula (1-95)
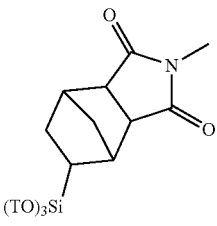
Formula (1-89)
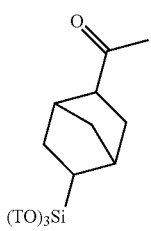
Formula (1-96)
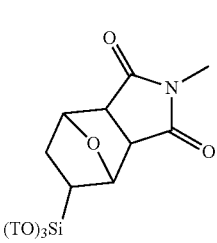
Formula (1-90)
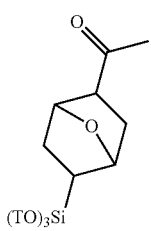
Formula (1-97)
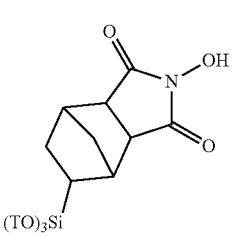
Formula (1-91)
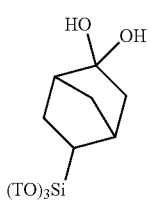
Formula (1-98)
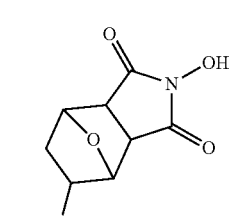
Formula (1-92)
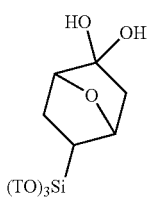
Formula (1-99)
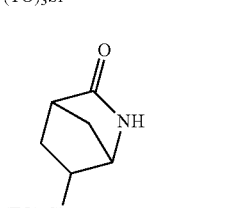
Formula (1-93)
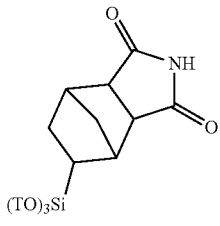
Formula (1-100)
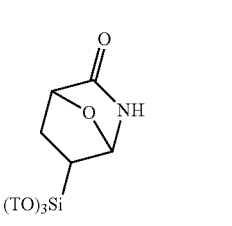

-continued

Formula (1-101)

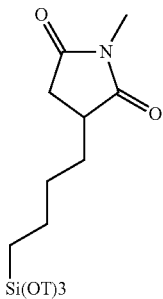

Formula (1-102)

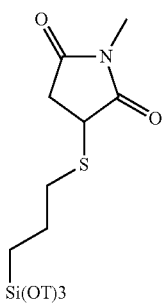

Formula (1-103)

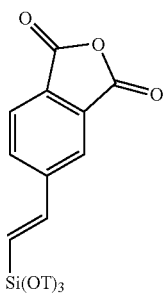

In the formulae above, T is a $C_{1-10}$ alkyl group, such as a methyl group or an ethyl group.

In the present invention, the hydrolyzable silane is a combination of the hydrolyzable silane of Formula (1) and another hydrolyzable silane, and as the other hydrolyzable silane, at least one hydrolyzable silane selected from the group consisting of hydrolyzable silanes of Formula (2) and Formula (3) below may be used.

In Formula (2), $R^4$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond; $R^5$ is an alkoxy group, an acyloxy group, or a halogen group; and c is an integer of 0 to 3.

In Formula (3), $R^6$ is an alkyl group and is bonded to a silicon atom through a Si—C bond; $R^7$ is an alkoxy group, an acyloxy group, or a halogen group; Y is an alkylene group or an arylene group; d is an integer of 0 or 1; and e is an integer of 0 or 1.

As the alkyl group; the aryl group; the halogenated alkyl group; the halogenated aryl group; the alkenyl group; or the organic group having an epoxy group, an acryloyl group, a methacryloyl group, a mercapto group, or a cyano group; the alkoxy group; the acyloxy group; and the halogen group, the above-mentioned examples may be used.

Examples of the silicon-containing compound of Formula (2) include tetramethoxysilane, tetrachlorosilane, tetraacetoxysilane, tetraethoxysilane, tetra-n-propoxysilane, tetraisopropoxysilane, tetra-n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltri propoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxy silane, 3-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane. δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane. α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane. γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltriniethoxysilane, vinyltrichiorosilane, vinyltriacetoxysilane, vinyltriethoxysilane, vinyltriacetoxysilane, methoxyphenyltrimethoxysilane, methoxyphenyltriethoxysilane, methoxyphenyltriacetoxysilane, methoxyphenyltrichiorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichiorosilane, isopropoxybenzyltrimethoxysilane, isopropoxybenzyltriethoxysilane, isopropoxybenzyltriacetoxysilane, isopropoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-metharyloxypropyltrimethoxysilane, γ-mercaptopropyltrimethoxysilane, γ-mercaptopropyltriethoxysilane, γ-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Furthermore, the following hydrolyzable silanes may be used.

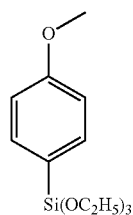

Formula (A-1)

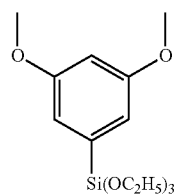

Formula (A-2)

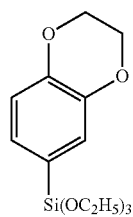

Formula (A-3)

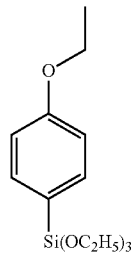

Formula (A-4)

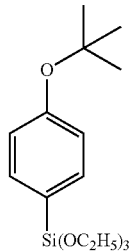

Formula (A-5)

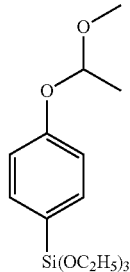

Formula (A-6)

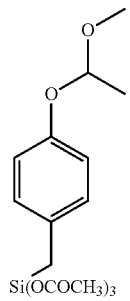

Formula (A-7)

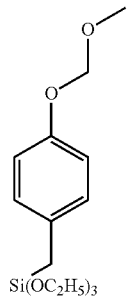

Formula (A-8)

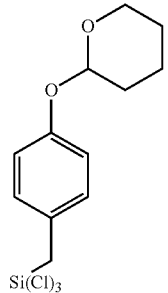

Formula (A-9)

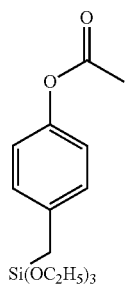
Formula (A-10)
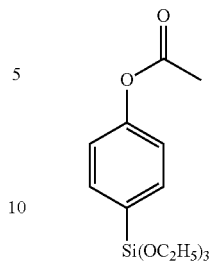
Formula (A-15)
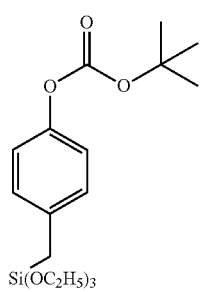
Formula (A-11)
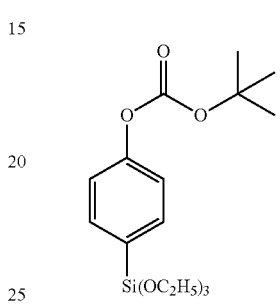
Formula (A-16)
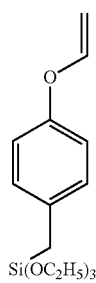
Formula (A-12)
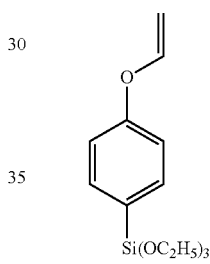
Formula (A-17)
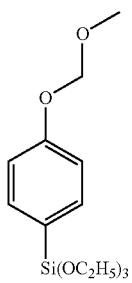
Formula (A-13)
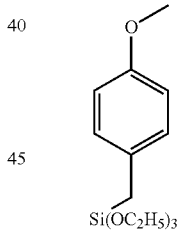
Formula (A-18)
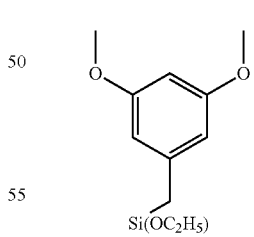
Formula (A-19)
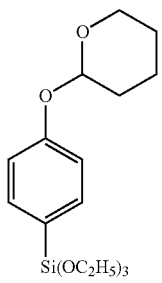
Formula (A-14)
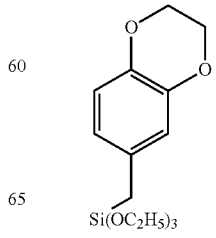
Formula (A-20)

Formula (A-21)
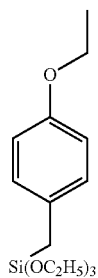
Formula (A-22)
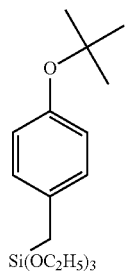
Formula (A-23)
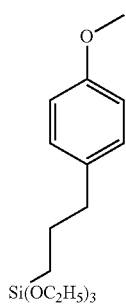
Formula (A-24)
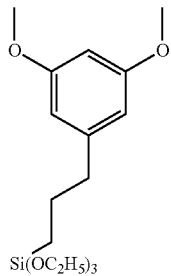
Formula (A-25)
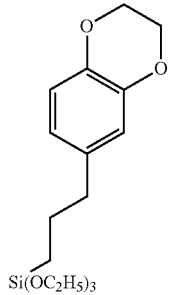
Formula (A-26)
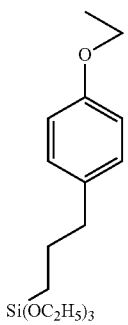
Formula (A-27)
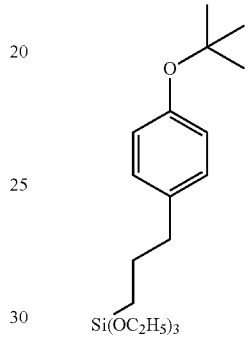
Formula (A-28)
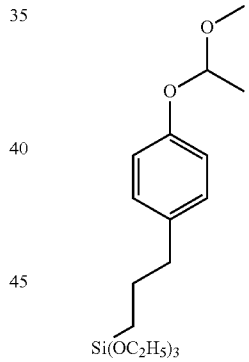
Formula (A-29)
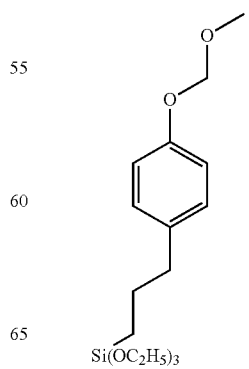

Formula (A-29)
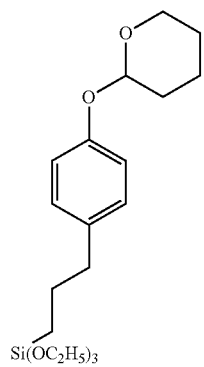
Formula (A-31)
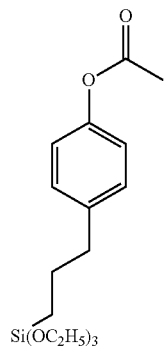
Formula (A-32)
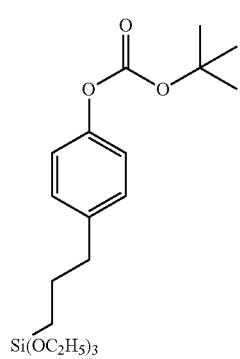
Formula (A-33)
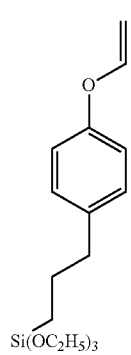
Formula (A-34)
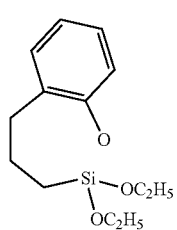
Formula (A-30)
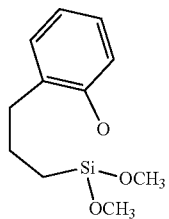
Formula (A-35)
Formula (A-36)
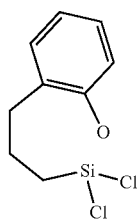
Formula (A-37)
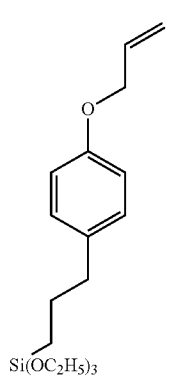
Formula (A-38)
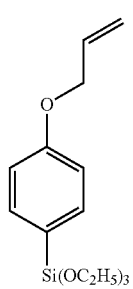
Formula (A-39)
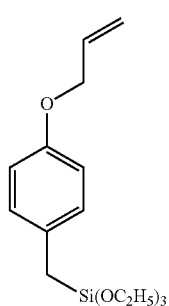

-continued
Formula (A-40)
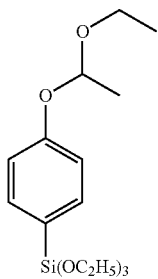
Formula (A-41)
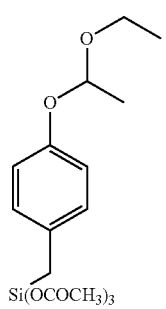
Formula (A-42)
Formula (A-43)
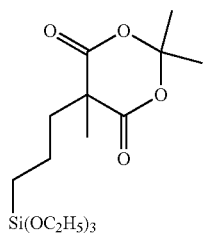
Formula (A-44)
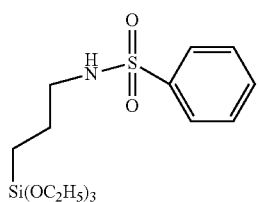
Formula (A-45)
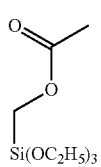
-continued
Formula (A-46)
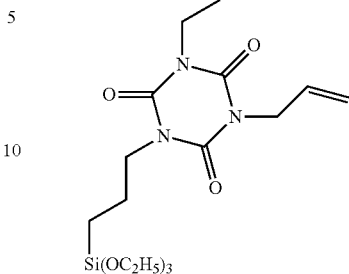
Formula (A-47)
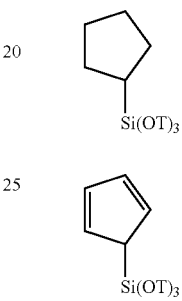
Formula (A-48)
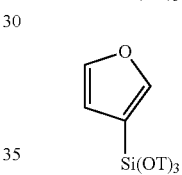
Formula (A-49)
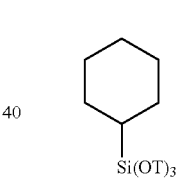
Formula (A-50)
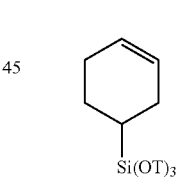
Formula (A-51)
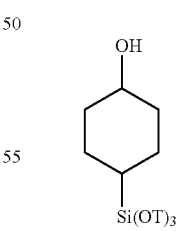
Formula (A-52)
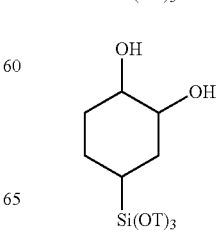
Formula (A-53)
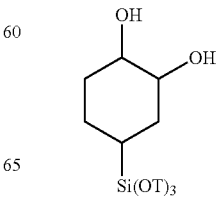

Formula (A-54)
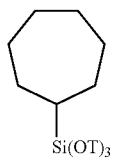
Formula (A-55)
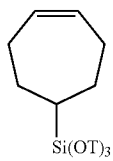
Formula (A-56)
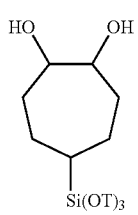
Formula (A-57)
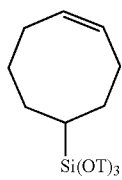
Formula (A-58)
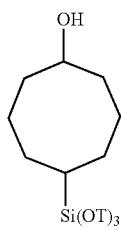
Formula (A-59)
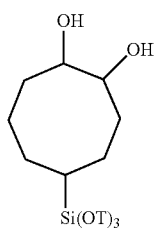
Formula (A-60)
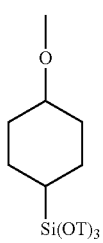
Formula (A-61)
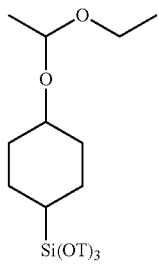
Formula (A-62)
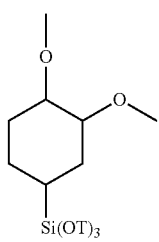
Formula (A-63)
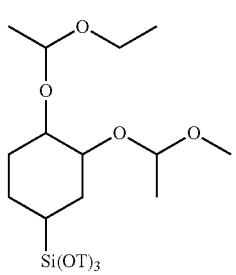
Formula (A-64)
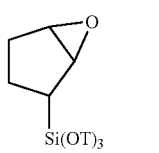
Formula (A-65)
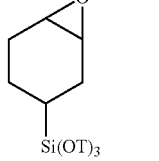
Formula (A-66)
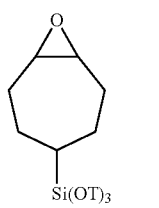
Formula (A-67)
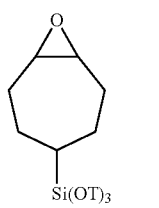
Examples of the silicon-containing compound of Formula (3) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Specific examples of the hydrolysis-condensation product (polysiloxane) used in the present invention are as follows.

Formula (2-1)

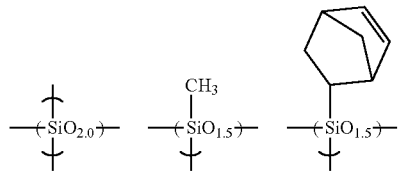

Formula (2-2)

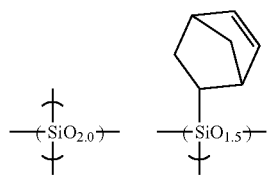

Formula (2-3)

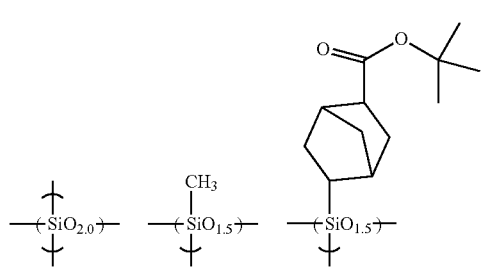

Formula (2-4)

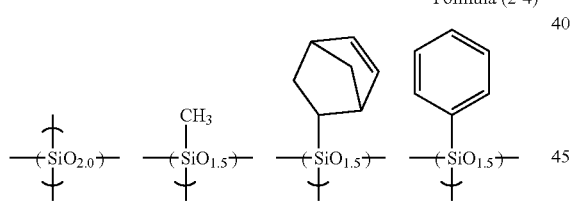

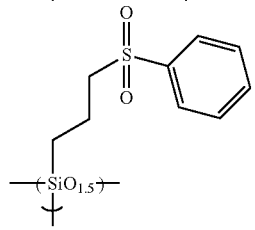

Formula (2-5)

-continued

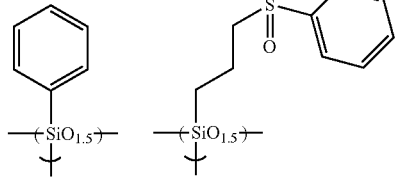

Formula (2-6)

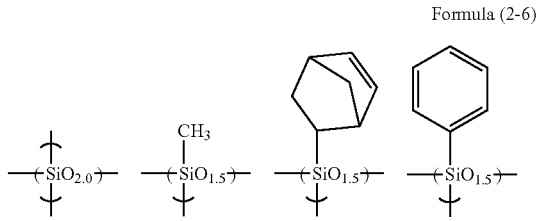

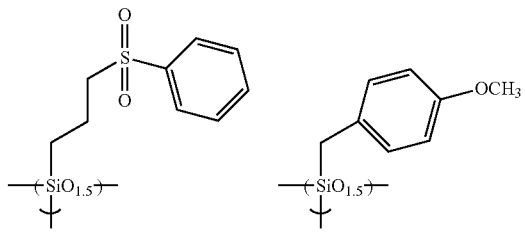

Formula (2-7)

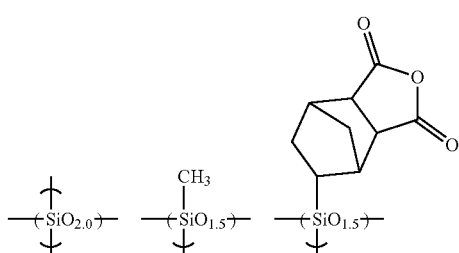

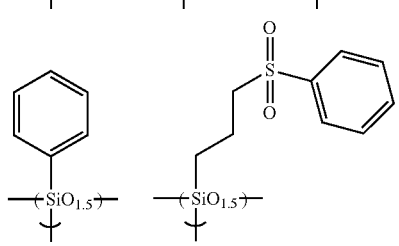

Formula (2-8)

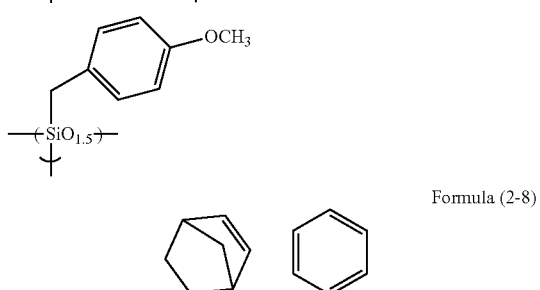

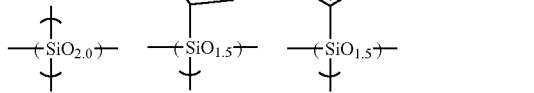

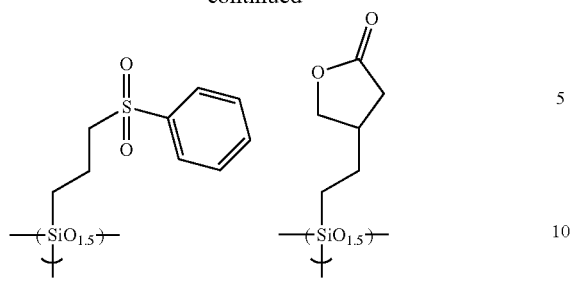
Formula (2-9)
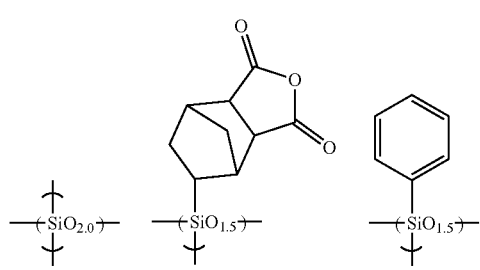
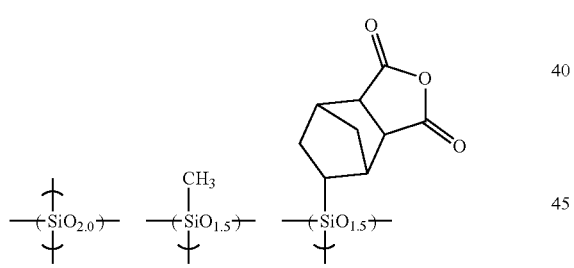
Formula (2-10)
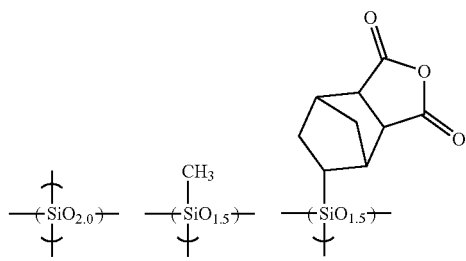
Formula (2-11)
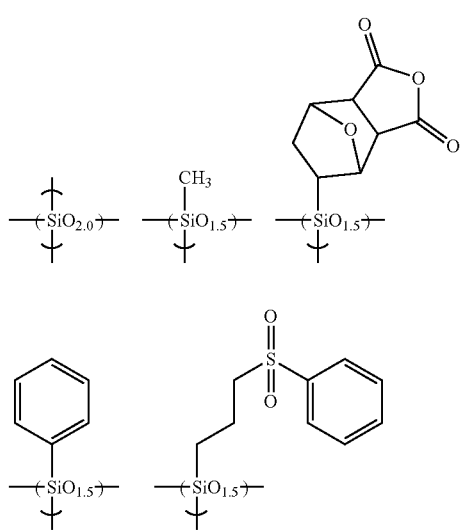
Formula (2-12)

Formula (2-13)

Formula (2-14)

Formula (2-15)

Formula (2-16)

Formula (2-17)

Formula (2-18)

-continued

Formula (2-19)

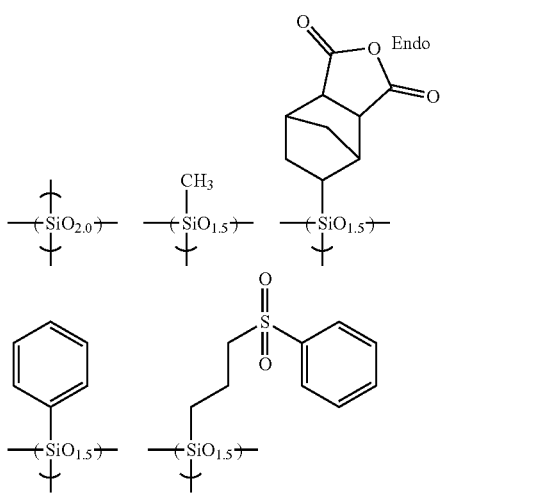

Formula (2-20)

Endo & Exo isomer

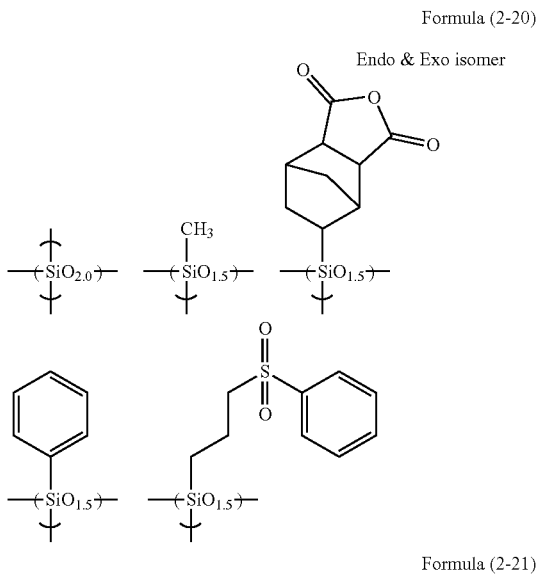

Formula (2-21)

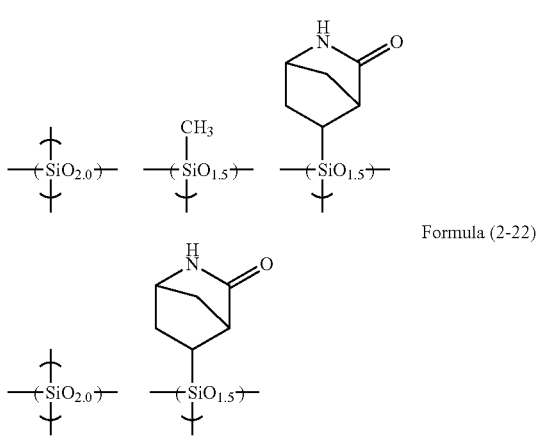

Formula (2-22)

The above-mentioned hydrolysis-condensation products (polyorganosiloxane) of the hydrolyzable silanes each have a weight average molecular weight of 1,000 to 1,000,000, or 1,000 to 100,000. The molecular weights of these hydrolysis-condensation products are obtained by GPC analysis in terms of polystyrene.

The GPC measurement can be performed under conditions, for example, using a GPC apparatus (the trade name HLC-8220GPC, manufactured by Tosoh Corporation), GPC columns (the trade name Shodex KF803L, KF802, and KF801, manufactured by Showa Denko K.K.), a column temperature of 40° C., tetrahydrofuran as an eluent (an elution solvent), a flow amount (a flow rate) of 1.0 ml/min, and polystyrene (manufactured by Showa Denko K.K.) as a standard sample.

For the hydrolysis of an alkoxysilyl group, an acyloxysilyl group, or a halogenated silyl group, 0.5 mol to 100 mol, preferably 1 mol to 10 mol of water is used per mol of the hydrolysable group.

Furthermore, 0.001 mol to 10 mol, preferably 0.001 mol to 1 mol of a hydrolysis catalyst, may be used per mol of the hydrolysable group.

The reaction temperature at the time of hydrolysis and condensation is normally 20° C. to 80° C.

The hydrolysis may be either completely or partially performed. That is, a hydrolysis product and a monomer may remain in a hydrolysis-condensation product.

A catalyst may be used for the hydrolysis and condensation.

Examples of the hydrolysis catalyst include a metal chelate compound, an organic acid, an inorganic acid, an organic base, and an inorganic base.

Examples of the metal chelate compound serving as the hydrolysis catalyst include: titanium chelate compounds, such as triethoxy mono(acetylacetonato)titanium, tri-n-propoxy mono(acetylacetonato)titanium, tri-i-propoxy mono(acetylacetonato)titanium, tri-n-butoxy mono(acetylacetonato)titanium, tri-sec-butoxy mono(acetylacetonato) titanium, tri-t-butoxy mono(acetylacetonato)titanium, diethoxy bis(acetylacetonato)titanium, di-n-propoxy bis (acetylacetonato)titanium, di-i-propoxy bis(acetylacetonato) titanium, di-n-butoxy bis(acetylacetonato)titanium, di-sec-butoxy bis(acetylacetonato)titanium, di-t-butoxy bis(acetylacetonato)titanium, monoethoxy tris(acetylacetonato)titanium, mono-n-propoxy tris(acetylacetonato)titanium, mono-i-propoxy tris(acetylacetonato)titanium, mono-n-butoxy tris(acetylacetonato)titanium, mono-sec-butoxy tris(acetylacetonato)titanium, mono-t-butoxy tris(acetylacetonato)titanium, tetrakis(acetylacetonato) titanium, triethoxy mono(ethylacetoacetate)titanium, tri-n-propoxy mono(ethylacetoacetate)titanium, tri-i-propoxy mono(ethylacetoacetate)titanium, tri-n-butoxy mono(ethylacetoacetate)titanium, tri-sec-butoxy mono(ethylacetoacetate)titanium, tri-t-butoxy mono(ethylacetoacetate)titanium, diethoxy bis(ethylacetoacetate)titanium, di-n-propoxy-bis (ethylacetoacetate)titanium, di-i-propoxy bis(ethylacetoacetate)titanium, di-n-butoxy bis(ethylacetoacetate)titanium, di-sec-butoxy bis(ethylacetoacetate)titanium, di-t-butoxy bis(ethylacetoacetate)titanium, monoethoxy tris(ethylacetoacetate)titanium, mono-n-propoxy tris(ethylacetoacetate) titanium, mono-i-propoxy tris(ethylacetoacetate)titanium, mono-n-butoxy tris(ethylacetoacetate)titanium, mono-sec-butoxy tris(ethylacetoacetate)titanium, mono-t-butoxy tris (ethylacetoacetate)titanium, tetrakis(ethylacetoacetate)titanium, mono(acetylacetonato)tris(ethylacetoacetate) titanium, bis(acetylacetonato)bis(ethylacetoacetate) titanium, and tris(acetylacetonato)mono(ethylacetoacetate) titanium; zirconium chelate compounds, such as triethoxy mono(acetylacetonato)zirconium, tri-n-propoxy mono (acetylacetonato)zirconium, tri-i-propoxy mono(acetylacetonato)zirconium, tri-n-butoxy mono(acetylacetonato)zirconium, tri-sec-butoxy mono(acetylacetonato)zirconium, tri-t-butoxy mono(acetylacetonato)zirconium, diethoxy bis(acetylacetonato)zirconium, di-n-propoxy bis(acetylacetonato)zirconium, di-i-propoxy bis(acetylacetonato)zirconium, di-n-butoxy bis(acetylacetonato)zirconium, di-sec-butoxy bis(acetylacetonato)zirconium, di-t-butoxy bis(acetylacetonato)zirconium, monoethoxy tris(acetylacetonato)zirconium, mono-n-propoxy tris(acetylacetonato)zirconium, mono-i-propoxy tris(acetylacetonato)zirconium, mono-n-butoxy tris(acetylacetonato)zirconium, mono-sec-butoxy tris(acetylacetonato)zirconium, mono-t-butoxy tris(acetylacetonato)zirconium, tetrakis(acetylacetonato)zirconium, triethoxy mono(ethylacetoacetate)zirconium, tri-n-propoxy mono(ethylacetoacetate)zirconium, tri-i-propoxy mono(ethylacetoacetate)zirconium, tri-n-butoxy mono(ethylacetoacetate)zirconium, tri-sec-butoxy mono(ethylacetoacetate)zirconium, tri-t-butoxy mono(ethylacetoacetate)zirconium, diethoxy bis(ethylacetoacetate)zirconium, di-n-propoxy bis(ethylacetoacetate)zirconium, di-i-propoxy bis(ethylacetoacetate)zirconium, di-n-butoxy bis(ethylacetoacetate)zirconium, di-sec-butoxy bis(ethylacetoacetate)zirconium, di-t-butoxy bis(ethylacetoacetate)zirconium, monoethoxy tris(ethylacetoacetate)zirconium, mono-n-propoxy tris(ethylacetoacetate)zirconium, mono-i-propoxy tris(ethylacetoacetate)zirconium, mono-n-butoxy tris(ethylacetoacetate)zirconium, mono-sec-butoxy tris(ethylacetoacetate)zirconium, mono-t-butoxy tris(ethylacetoacetate)zirconium, tetrakis(ethylacetoacetate)zirconium, mono(acetylacetonato)tris(ethylacetoacetate)zirconium, bis(acetylacetonato)bis(ethylacetoacetate)zirconium, and tris(acetylacetonato)mono(ethylacetoacetate)zirconium; and aluminum chelate compounds, such as tris(acetylacetonato)aluminum and tris(ethylacetoacetate)aluminum.

Examples of the organic acid serving as the hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acids, phthalic acid, fumaric acid, citric acid, and tartaric acid.

Examples of the inorganic acid serving as the hydrolysis catalyst include hydrochloric acid, nitric acid, sulfuric acid, hydrofluoric acid, and phosphoric acid.

Examples of the organic base serving as the hydrolysis catalyst include pyridine, pyrrole, piperazine, pyrrolidine, piperidine, picoline, trimethylamine, triethylamine, monoethanolamine, diethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of the inorganic base include ammonia, sodium hydroxide, potassium hydroxide, barium hydroxide, and calcium hydroxide. Among these catalysts, the metal chelate compounds, the organic acids, and the inorganic acids are preferable, and these catalysts may be used alone or in combination of two or more kinds thereof.

Examples of the organic solvent used for the hydrolysis include: aliphatic hydrocarbon-based solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon-based solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monohydric alcohol-based solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol-based solvents, such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerol; ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether-based solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester-based solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, N-methylpyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more kinds thereof.

In particular, ketone-based solvents, such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone, are preferable in terms of the preservation stability of the solutions.

Furthermore, bisphenol S or a bisphenol S derivative may be added as an additive. The amount of bisphenol S or a bisphenol S derivative added is 0.01 part by mass to 20 parts by mass, 0.01 part by mass to 10 parts by mass, or 0.01 part by mass to 5 parts by mass with respect to 100 parts by mass of polyorganosiloxane.

Preferable examples of the bisphenol S and the bisphenol S derivative are as follows.

Formula (C-1)
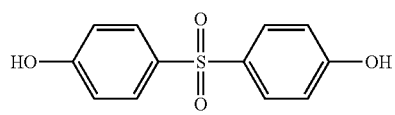

Formula (C-2)
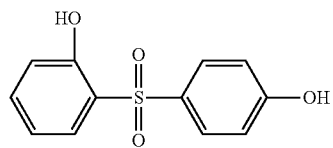

Formula (C-3)
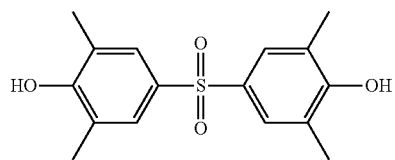

Formula (C-4)
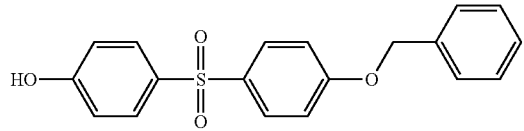

Formula (C-5)
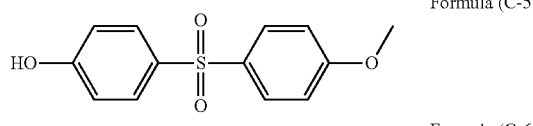

Formula (C-6)
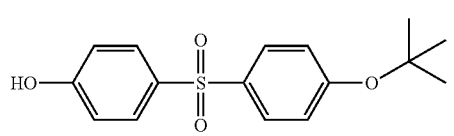

-continued

Formula (C-7)
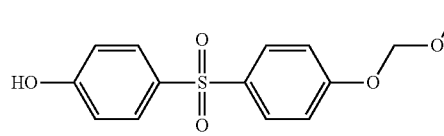

Formula (C-8)
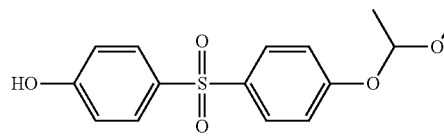

Formula (C-9)
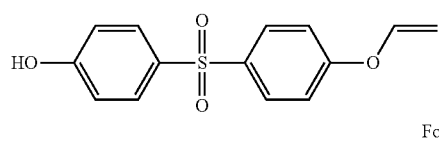

Formula (C-10)
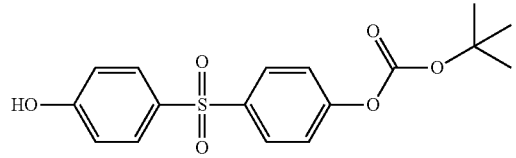

Formula (C-11)
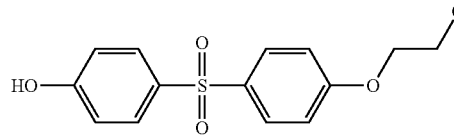

Formula (C-12)
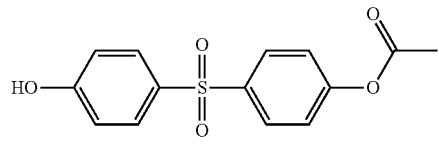

Formula (C-13)
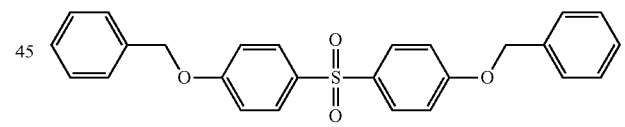

Formula (C-14)
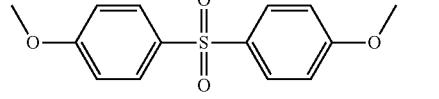

Formula (C-15)
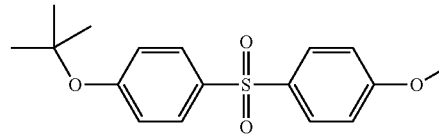

Formula (C-16)
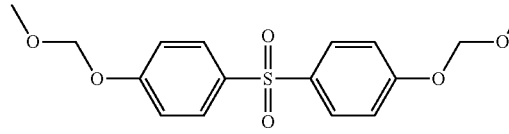

Formula (C-17)
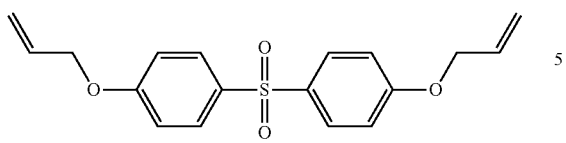

Formula (C-18)
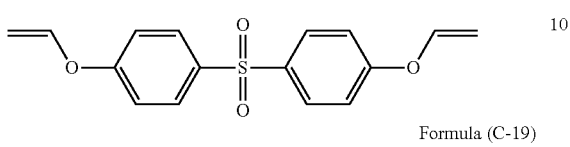

Formula (C-19)
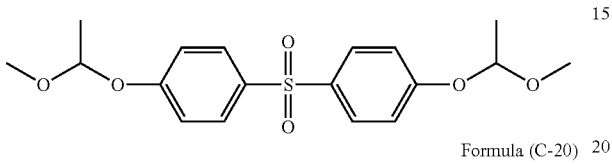

Formula (C-20)
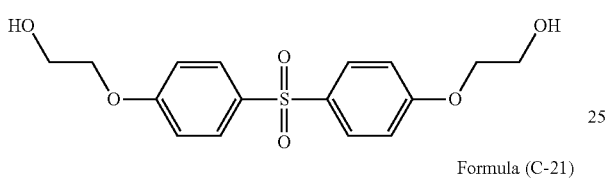

Formula (C-21)
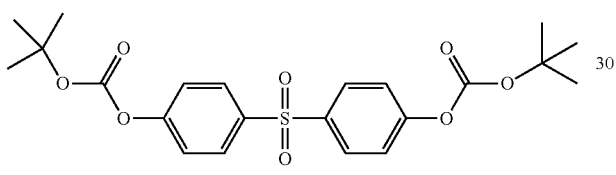

Formula (C-22)
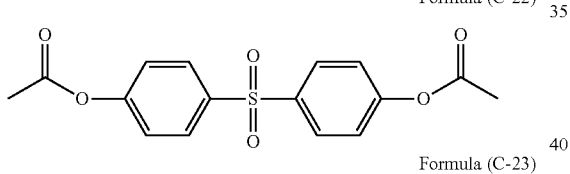

Formula (C-23)
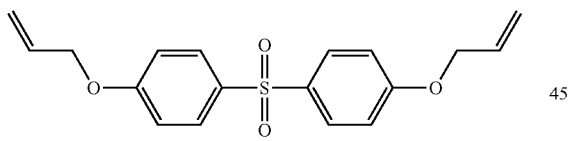

Furthermore, in the present invention, an aliphatic polycyclic compound, an aliphatic polycyclic dicarboxylic acid, or an aliphatic polycyclic dicarboxylic acid anhydride, each optionally having a double bond, a hydroxy group, or an epoxy group, may be added. An aliphatic polycyclic dicarboxylic acid anhydride may be preferably used.

Examples of these additives are as follows.

Formula (C1-1)

Formula (C1-2)

Formula (C1-3)

Formula (C1-4)
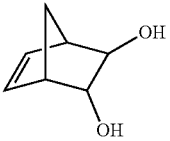

Formula (C1-5)
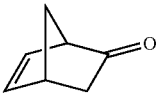

Formula (C1-6)
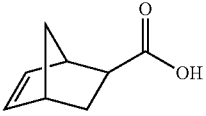

Formula (C1-7)
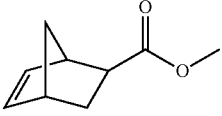

Formula (C1-8)
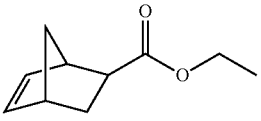

Formula (C1-9)
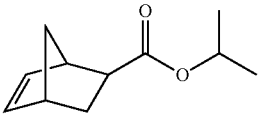

Formula (C1-10)
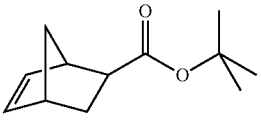

Formula (C1-11)
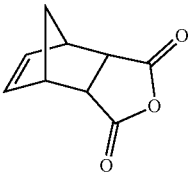

endo

Formula (C1-12)

exo

-continued
Formula (C1-13)
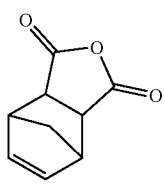
endo & exo isomer
Formula (C1-14)
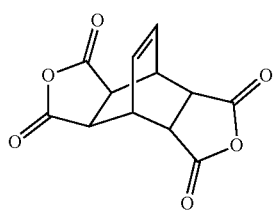
Formula (C1-15)
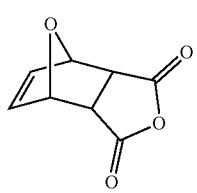
Formula (C1-16)
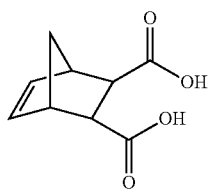
Formula (C1-17)
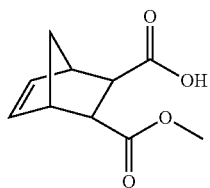
Formula (C1-18)
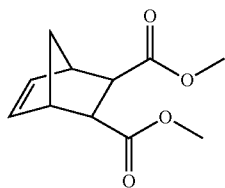
Formula (C1-19)
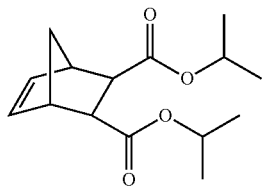
Formula (C1-20)
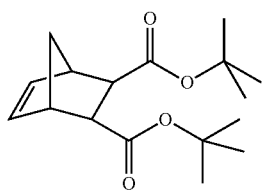
-continued
Formula (C1-21)
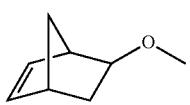
Formula (C1-22)
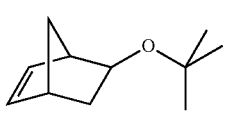
Formula (C1-23)
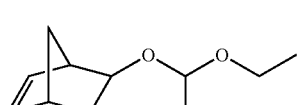
Formula (C1-24)
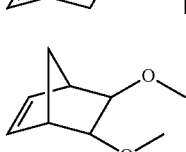
Formula (C1-25)
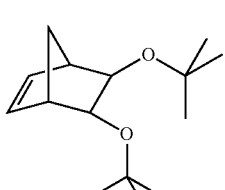
Formula (C1-26)
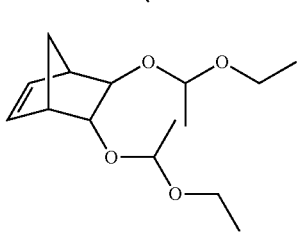
Formula (C1-27)
Formula (C1-28)
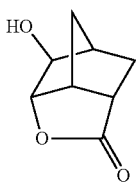
Formula (C1-29)
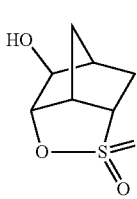
Formula (C1-30)
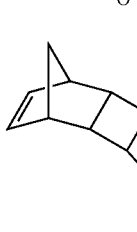

Formula (C1-31)
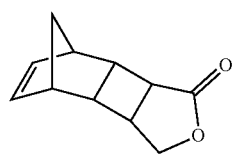
Formula (C1-32)
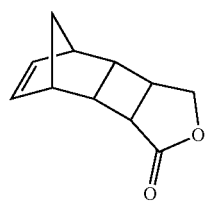
Formula (C1-33)
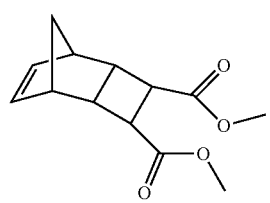
Formula (C1-34)
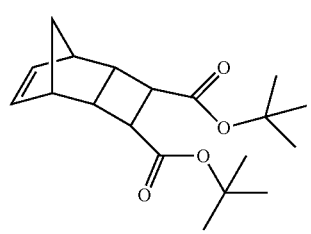
Formula (C1-35)
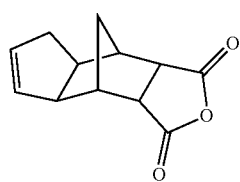
Formula (C1-36)
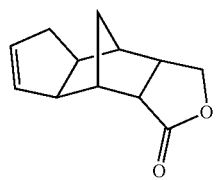
Formula (C1-37)
Formula (C1-38)
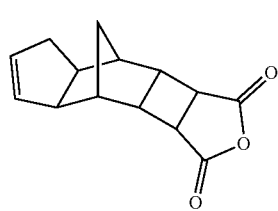
Formula (C1-39)
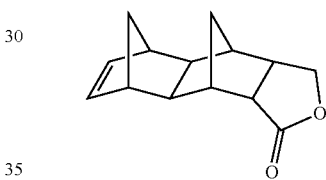
Formula (C1-40)
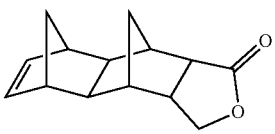
Formula (C1-41)
Formula (C1-42)
Formula (C1-43)
Formula (C1-44)
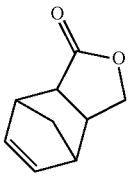
Formula (C1-45)
Formula (C1-46)
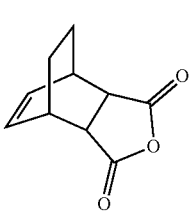

Formula (C1-47)
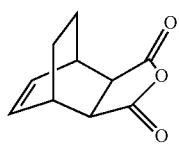
Formula (C1-48)
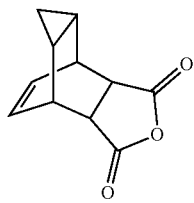
Formula (C1-49)
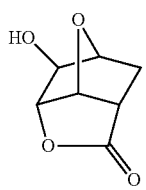
Formula (C1-50)
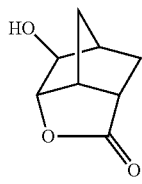
Formula (C1-51)
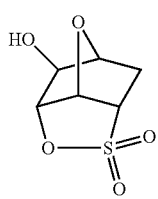
Formula (C1-52)
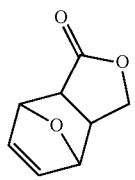
Formula (C1-53)
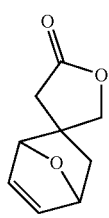
Formula (C1-54)
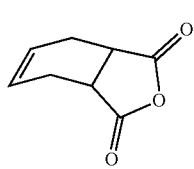
Formula (C1-55)
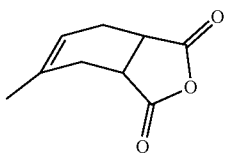
Formula (C1-56)
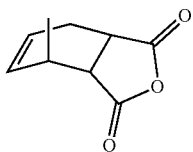
Formula (C1-57)
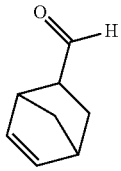
Formula (C1-58)
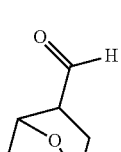
Formula (C1-59)
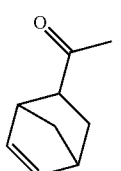
Formula (C1-60)
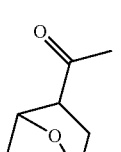
Formula (C1-61)
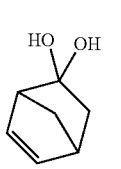
Formula (C1-62)
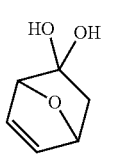
Formula (C1-63)

-continued
Formula (C1-64)
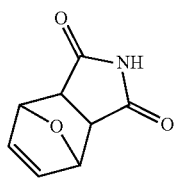
Formula (C1-65)
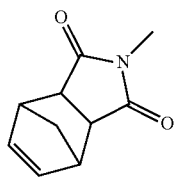
Formula (C1-66)
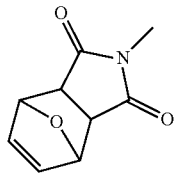
Formula (C1-67)
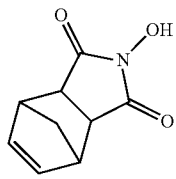
Formula (C1-68)
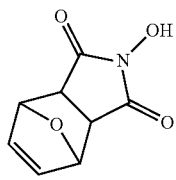
Formula (C1-69)
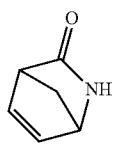
Formula (C1-70)
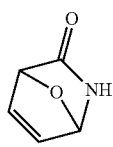
Formula (C1-71)
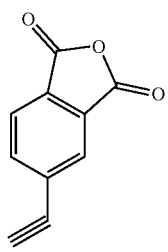
-continued
Formula (C1-72)
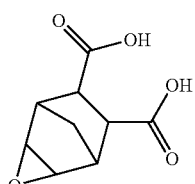
Formula (C1-73)
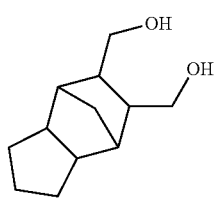
Formula (C1-74)
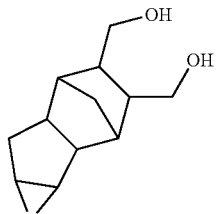
Formula (C1-75)
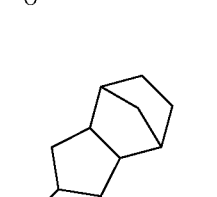
Formula (C1-76)
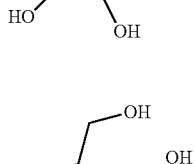
Formula (C1-77)
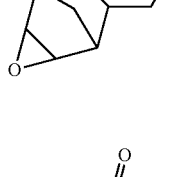
Formula (C1-78)
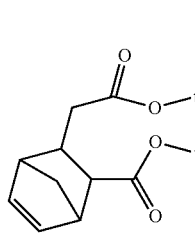

Formula (C1-79)
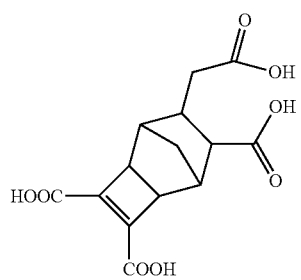
Formula (C1-80)
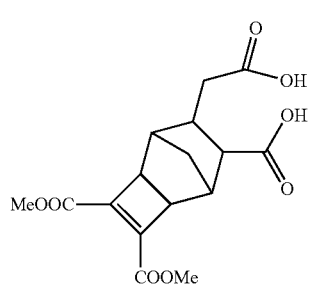
Formula (C1-81)
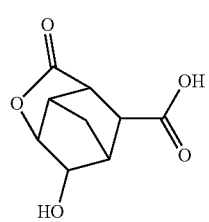
Formula (C1-82)
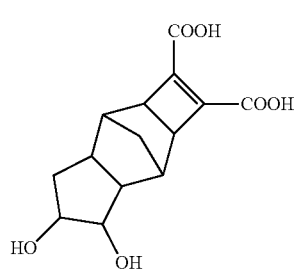
Formula (C1-83)
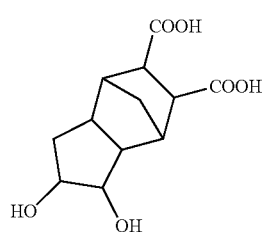
Formula (C1-84)
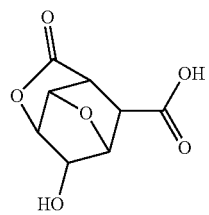
Formula (C1-85)
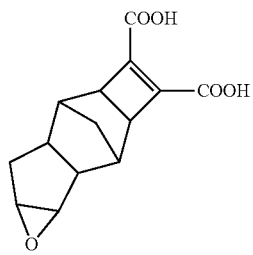
Formula (C1-86)
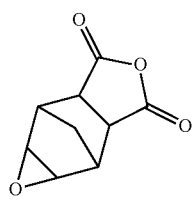
Formula (C1-87)
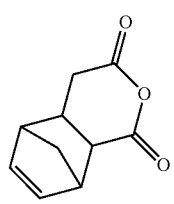
Formula (C1-88)
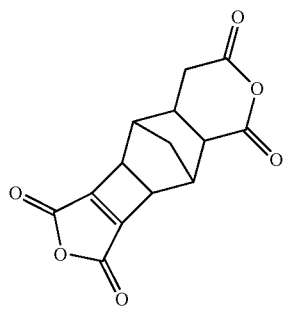
Formula (C1-89)
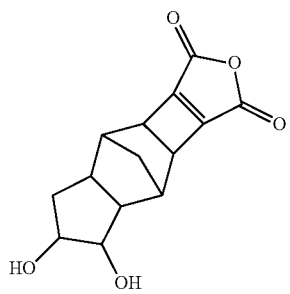
Formula (C1-90)
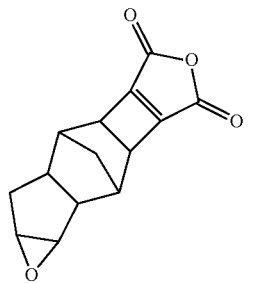

Formula (C1-91)

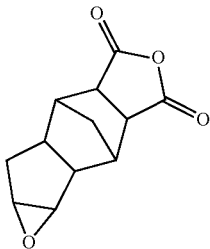

The resist underlayer film-forming composition of the present invention may include a curing catalyst. The curing catalyst acts as a curing catalyst when a coating film containing polyorganosiloxane formed from a hydrolysis-condensation product is heated and cured.

As the curing catalyst, ammonium salts, phosphines, phosphonium salts, and sulfonium salts may be used.

Examples of the ammonium salts include: a quaternary ammonium salt having a structure of Formula (D-1):

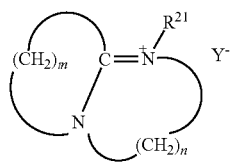

Formula (D-1)

(where m is an integer of 2 to 11; n is an integer of 2 to 3; $R^{21}$ is an alkyl group or an aryl group; and $Y^-$ is an anion);
a quaternary ammonium salt having a structure of Formula (D-2):

$R^{22}R^{23}R^{24}R^{25}N^+Y^-$        Formula(D-2)

(where each of $R^{22}$, $R^{23}$, $R^{24}$, and $R^{25}$ is an alkyl group or an aryl group; N is a nitrogen atom; $Y^-$ is an anion; and each of $R^{22}$, $R^{23}$, $R^{24}$, and $R^{25}$ is bonded to the nitrogen atom through a C—N bond);
a quaternary ammonium salt having a structure of Formula (D-3):

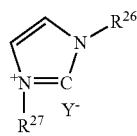

Formula (D-3)

(where each of $R^{26}$ and $R^{27}$ is an alkyl group or an aryl group; and $Y^-$ is an anion); a quaternary ammonium salt having a structure of Formula (D-4):

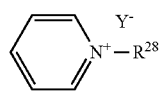

Formula (D-4)

(where $R^{28}$ is an alkyl group or an aryl group; and Y is an anion);
a quaternary ammonium salt having a structure of Formula (D-5):

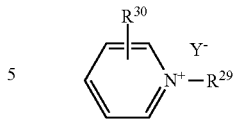

Formula (D-5)

(where each of $R^{29}$ and $R^{30}$ is an alkyl group or an aryl group; and $Y^-$ is an anion); and
a tertiary ammonium salt having a structure of Formula (D-6):

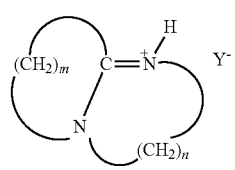

Formula (D-6)

(where m is an integer of 2 to 11; n is an integer of 2 to 3; H is a hydrogen atom; and $Y^-$ is an anion).

Examples of the phosphonium salts include a quaternary phosphonium salt of Formula (D-7):

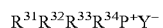

$R^{31}R^{32}R^{33}R^{34}P^+Y^-$        Formula(D-7)

(where each of $R^{31}$, $R^{32}$, $R^{33}$, and $R^{34}$ is an alkyl group or an aryl group; P is a phosphorus atom; $Y^-$ is an anion; and each of $R^{31}$, $R^{32}$, $R^{33}$, and $R^{34}$ is bonded to the phosphorus atom through a C—P bond).

Examples of the sulfonium salts include a tertiary sulfonium salt of Formula (D-8):

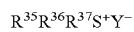

$R^{35}R^{36}R^{37}S^+Y^-$        Formula (D-8)

(where each of $R^{35}$, $R^{36}$, and $R^{37}$ is an alkyl group or an aryl group; S is a sulfur atom; $Y^-$ is an anion; and each of $R^{35}$, $R^{36}$, and $R^{37}$ is bonded to the sulfur atom through a C—S bond).

The compound of Formula (D-1) above is a quaternary ammonium salt derived from an amine, and, in Formula (D-1), m is an integer of 2 to 11 and n is an integer of 2 to 3. $R^{21}$ of this quaternary ammonium salt is a $C_{1-18}$, preferably $C_{2-10}$ alkyl or aryl group. Examples of $R^{21}$ include linear alkyl groups, such as ethyl group, propyl group and butyl group, benzyl group, cyclohexyl group, cyclohexylmethyl group, and dicyclopentadienyl group. Examples of the anion ($Y^-$) include: halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$).

The compound of Formula (D-2) above is a quaternary ammonium salt having a structure of $R^{22}R^{23}R^{24}R^{25}N^+Y^-$. Each of $R^{22}$, $R^{23}$, $R^{24}$, and $R^{25}$ of this quaternary ammonium salt is a $C_{1-18}$ alkyl or aryl group, or a silane compound bonded to a silicon atom through a Si—C bond. Examples of the anion ($Y^-$) include: halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). This quarternary ammonium salt is commercially available, and examples of this quarternary ammonium salt include tetramethylammonium acetate, tetrabutylammonium acetate, benzyltriethylammonium chloride, benzyltriethylammonium bromide, methyltrioctylammonium chloride, benzyltributylammonium chloride, and benzyltrimethylammonium chloride.

The compound of Formula (D-3) is a quarternary ammonium salt derived from a 1-substituted imidazole, and, in Formula (D-3), each of $R^{26}$ and $R^{27}$ has a $C_{1-18}$, and the sum total of the number of carbon atoms of $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion ($Y^-$) include: halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). Although this compound is commercially available, the compound can be produced, for example, by a reaction between an imidazole-based compound, such as 1-methylimidazole or 1-benzylimidazole, and an alkyl halide or an aryl halide, such as benzyl bromide or methyl bromide.

The compound of Formula (D-4) above is a quarternary ammonium salt derived from pyridine, and in Formula (D-4), $R^{28}$ is a $C_{1-18}$, preferably $C_{4-18}$ alkyl or aryl group, and examples of $R^{28}$ include butyl group, octyl group, benzyl group, and lauryl group. Examples of the anion ($Y^-$) include: halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). Although this compound is commercially available, the compound can be produced, for example, by a reaction between pyridine and an alkyl halide or an aryl halide, such as lauryl chloride, benzyl chloride, benzyl bromide, methyl bromide, or octyl bromide. Examples of this compound include N-laurylpyridinium chloride and N-benzylpyridinium bromide.

The compound of Formula (D-5) above is a quarternary ammonium salt derived from a substituted pyridine, represented by picoline, and in Formula (D-5), $R^{29}$ is a $C_{1-18}$, preferably $C_{4-18}$ alkyl or aryl group, and examples of $R^{29}$ include methyl group, octyl group, lauryl group, and benzyl group. $R^{30}$ is a $C_{1-18}$ alkyl or aryl group, and, when the compound is, for example, a quarternary ammonium derived from picoline, $R^{30}$ is a methyl group. Examples of the anion ($Y^-$) include: halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). Although this compound is commercially available, the compound can be produced, for example, by a reaction between a substituted pyridine, such as picoline, and an alkyl halide or an aryl halide, such as methyl bromide, octyl bromide, lauryl chloride, benzyl chloride, or benzyl bromide. Examples of this compound include N-benzylpicolinium chloride, N-benzylpicolinium bromide, and N-laurylpicolinium chloride.

The compound of Formula (D-6) is a tertiary ammonium salt derived from an amine, and, in Formula (D-6), m is an integer of 2 to 11 and n is an integer of 2 to 3. Examples of the anion ($Y^-$) include: halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). The compound can be produced, for example, by a reaction between an amine and a weak acid, such as a carboxylic acid or phenol. Examples of the carboxylic acid include formic acid and acetic acid. In the case of using formic acid, the anion ($Y^-$) is ($HCOO^-$). In the case of using acetic acid, the anion ($Y^-$) is ($CH_3COO^-$). Alternatively, in the case of using phenol, the anion ($Y^-$) is ($C_6H_5O^-$).

The compound of Formula (D-7) above is a quaternary phosphonium salt having a structure of $R^{31}R^{32}R^{33}R^{34}P^+Y^-$. Each of $R^{31}$, $R^{32}$, $R^{33}$, and $R^{34}$ is a $C_{1-18}$ alkyl or aryl group, or a silane compound bonded to a silicon atom through a Si—C bond. Three of the four substituents, $R^{31}$ to $R^{34}$, are preferably a phenyl group or a substituted phenyl group, and examples of the substituents include phenyl group and tolyl group. The remaining one substituent is a $C_{1-18}$ alkyl or aryl group, or a silane compound bonded to a silicon atom through a Si—C bond. Examples of the anion ($Y^-$) include: halide ions, such as chloride ion ($Cl^-$), bromide ion ($Br^-$), and iodide ion ($I^-$); and acid groups, such as carboxylate (—$COO^-$), sulfonate (—$SO_3^-$), and alcoholate (—$O^-$). This compound is commercially available, and examples of the compound include: tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; triphenylbenzylphosphonium halides; tetraphenylphosphonium halides; tritolylmonoarylphosphonium halides; and tritolylmonoalkylphosphonium halides (in which a halogen atom is a chlorine atom or a bromine atom). In particular, triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (in which a halogen atom is a chlorine atom or a bromine atom), are preferable.

Examples of the phosphines include: primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) above is a tertiary sulfonium salt having a structure of $R^{35}R^{36}R^{37}S^+Y^-$. Each of $R^{35}$, $R^{36}$, and $R^{37}$ is a $C_{1-18}$ alkyl or aryl group, or a silane compound bonded to a silicon atom through a Si—C bond. Two of the three substituents, $R^{35}$ to $R^{37}$, are preferably a phenyl group or a substituted phenyl group, and examples of the substituents include phenyl group and tolyl group. The remaining one substituent is a $C_{1-18}$ alkyl or aryl group. Examples of the anion ($Y^-$) include: halide ions, such as chloride ion ($Cl^-$), bromide ion ($Br^-$), and iodide ion ($I^-$); and acid groups, such as carboxylate (—$COO^-$), sulfonate (—$SO_3^-$), alcoholate (—$O^-$), maleic acid anion, and nitric acid anion. This compound is commercially available, and examples of the compound include: tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; triphenyl sulfonium halides (in which a halogen atom is a chlorine atom or a bromine atom); tetraalkylphosphonium carboxylates, such as tri-n-butylsulfonium carboxylate, and tri-n-propylsulfonium carboxylate; trialkylbenzylsulfonium carboxylates, such as diethylbenzylsulfonium carboxylate; diphenylmonoalkylsulfonium carboxylates, such as diphenylmethylsulfonium carboxylate and diphenylethylsulfonium carboxylate; and triphenylsulfonium carboxylate.

Triphenylsulfonium halides and triphenylsulfonium carboxylate may be preferably used.

Furthermore, in the present invention, a nitrogen-containing silane compound may be added as a curing catalyst. Examples of the nitrogen-containing silane compound include an imidazole-ring-containing silane compound, such as N-(3-triethoxysilylpropyl)-4,5-dihydroimidazole.

The amount of the curing catalyst added is 0.01 part by mass to 10 parts by mass, 0.01 part by mass to 5 parts by mass, or 0.01 part by mass to 3 parts by mass with respect to 100 parts by mass of polyorganosiloxane.

A hydrolyzable silane is hydrolyzed and condensed using a catalyst in a solvent, and alcohols as byproducts, the used hydrolysis catalyst, and water can be removed from an obtained hydrolysis-condensation product (a polymer) at the same time, for example, by distillation under reduced pressure. Furthermore, an acid catalyst or a base catalyst used in the hydrolysis can be removed by neutralization or ion exchange. In the resist underlayer film-forming composition for lithography of the present invention, an organic acid, water, alcohol, or a combination thereof may be added for the purpose of stabilizing the resist underlayer film-forming composition including the hydrolysis-condensation product.

Examples of the above-mentioned organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among these, oxalic acid, maleic acid and the like are preferable. The amount of the organic acid added is 0.1 part by mass to 5.0 parts by mass with respect to 100 parts by mass of a condensation product (polyorganosiloxane). Furthermore, pure water, ultrapure water, and ion exchange water may be used as the water to be added, and the amount of the water added may be 1 part by mass to 20 parts by mass with respect to 100 parts by mass of the resist underlayer film-forming composition.

As the alcohol to be added, alcohol that easily disperses with heating after the application is preferable, and examples of the alcohol include methanol, ethanol, propanol, isopropanol, and butanol. The amount of the alcohol added may be 1 part by mass to 20 parts by mass with respect to 100 parts by mass of the resist underlayer film-forming composition.

Besides the above-mentioned components, the underlayer film-forming composition for lithography of the present invention may include an organic polymer compound, a photoacid generator, and a surfactant, as necessary.

The use of an organic polymer compound allows the adjustment of the dry etching rate (the amount of reduction in film thickness per unit time), the attenuation coefficient, the refractive index and the like of a resist underlayer film formed from the underlayer film-forming composition for lithography of the present invention.

The organic polymer compound is not limited to a particular compound, and various kinds of organic polymers may be used. For example, polycondensation polymers and addition polymerization polymers may be used. Examples of the addition polymerization polymers and polycondensation polymers to be used include polyesters, polystyrenes, polyimides, acrylic polymers, methacrylic polymers, polyvinyl ethers, phenol novolacs, naphthol novolacs, polyethers, polyamides, and polycarbonates. Organic polymers having aromatic ring structures, such as a benzene ring, a naphthalene ring, an anthracene ring, a triazine ring, a quinoline ring, and a quinoxaline ring, are preferably used.

Examples of the organic polymer compound include: addition polymerization polymers including, as a structural unit thereof, addition polymerizable monomers, such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide; and polycondensation polymers, such as phenol novolacs and naphthol novolacs.

In the case where an addition polymerization polymer is used as the organic polymer compound, the polymer compound may be a homopolymer or a copolymer. For the manufacture of the addition polymerization polymer, an addition polymerizable monomer is used. Examples of the addition polymerizable monomer include acrylic acid, methacrylic acid, an acrylic ester compound, a methacrylic ester compound, an acrylamide compound, a methacrylamide compound, a vinyl compound, a styrene compound, a maleimide compound, maleic anhydride, and acrylonitrile.

Examples of the acrylic ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornane-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide. N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylmethacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyl trimethoxy silane, 2-chloroethyl vinyl ether, 2-methoxyethyl vinyl ether, vinyl naphthalene, and vinyl anthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

In the case of using a polycondensation polymer as the polymer, examples of the polymer include a polycondensation polymer of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polycondensation polymer include polyesters, polyamides, and polyimides, such as polypyromellitic imides, poly(p-phenylene terephthalamide)s, polybutylene terephthalates, and polyethylene terephthalates.

In the case where the organic polymer compound has a hydroxy group, this hydroxy group can cause a crosslinking reaction with a polyorganosiloxane.

As the organic polymer compound, a polymer compound having a weight average molecular weight of, for example, 1,000 to 1,000,000, 3,000 to 300,000, 5,000 to 200,000, or 10,000 to 100,000 may be used.

The organic polymer compounds may be used alone, or in combination of two or more kinds thereof.

In the case of using the organic polymer compound, the amount of the organic polymer compound is 1 part by mass to 200 parts by mass, 5 parts by mass to 100 parts by mass, 10 parts by mass to 50 parts by mass, or 20 parts by mass to 30 parts by mass with respect to 100 parts by mass of a polycondensate (polyorganosiloxane).

The resist underlayer film-forming composition of the present invention may include an acid generator.

Examples of the acid generator include thermal acid generators and photoacid generators.

Photoacid generators generate an acid at the time of the light exposure of the resist. Accordingly, the acidity of an underlayer film can be adjusted. This is one method for adjusting the acidity of an underlayer film to the acidity of a resist serving as an upper layer. Furthermore, the adjustment of acidity of an underlayer film allows the pattern shape of a resist formed as the upper layer to be adjusted.

Examples of the photoacid generator included in the resist underlayer film-forming composition of the present invention include an onium salt compound, a sulfonimide compound, and a disulfonyldiazomethane compound.

Examples of the onium salt compound include: iodonium salt compounds, such as diphenyliodonium hexafluorophosphate, diphenyliodonium trifluoromethanesulfonate, diphenyliodonium nonafluoro normal-butane sulfonate, diphenyliodonium perfluoro normal-octane sulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro normal-butane sulfonate, triphenylsulfonium camphorsulfonate, and triphenylsulfonium trifluoromethanesulfonate.

Examples of the sulfonimide compound include N-(trifluoromethanesulfonyloxy)succinimide, N-(nonafluoro normal-butane sulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photoacid generators may be used alone, or in combination of two or more kinds thereof:

In the case of using the photoacid generator, the amount of the photoacid generator is 0.01 part by mass to 15 parts by mass, 0.1 part by mass to 10 parts by mass, or 0.5 part by mass to 5 part by mass with respect to 100 parts by mass of a polycondensation product (polyorganosiloxane).

Surfactants effectively suppress the formation of pinholes, striations and the like when the resist underlayer film-forming composition for lithography of the present invention is applied to a substrate.

Examples of a surfactant included in the resist underlayer film-forming composition of the present invention include: nonionic surfactants, such as polyoxyethylene alkyl ethers including polyoxyethylene lauryl ethers, polyoxyethylene stearyl ethers, polyoxyethylene cetyl ethers, and polyoxyethylene oleyl ethers, polyoxyethylene alkylaryl ethers, including polyoxyethylene octylphenol ethers and polyoxyethylene nonylphenol ethers, polyoxyethylene-polyoxypropylene block copolymers, sorbitan fatty acid esters, including sorbitan monolaurates, sorbitan monopalmitates, sorbitan monostearates, sorbitan monooleates, sorbitan trioleates, and sorbitan tristearates, polyoxyethylene sorbitan fatty acid esters, including polyoxyethylene sorbitan monolaurates, polyoxyethylene sorbitan monopalmitates, polyoxyethylene sorbitan monostearates, polyoxyethylene sorbitan trioleates, and polyoxyethylene sorbitan tristearates; fluorine-based surfactants, such as the trade names EFTOP EF301, EF303, and EF352 (manufactured by Tohkem Products Corporation), the trade names MEGAFAC F1171, F1173, R-08, R-30, R-30N, and R-40LM (manufactured by DIC Corporation), Fluorad FC430 and FC431 (manufactured by Sumitomo 3M Limited), the trade names Asahi Guard AG710, SURFLON S-382, SC101, SC102, SC103, SC104, SC105, and SC106 (manufactured by Asahi Glass Co., Ltd.); and an organosiloxane polymer KP341 (manufactured by Shin-Etsu Chemical Co., Ltd.). These surfactants may be used alone, or in combination of two or more kinds thereof. In the case of using the surfactant, the amount of the surfactant is 0.0001 part by mass to 5 parts by mass, 0.001 part by mass to 1 part by mass, or 0.01 part by mass to 1 part by mass with respect to 100 parts by mass of a polycondensation product (polyorganosiloxane).

Furthermore, to the resist underlayer film-forming composition of the present invention, a rheology controlling agent and an adhesion assistant may be added. A rheology controlling agent effectively improves the fluidity of the underlayer film-forming composition. An adhesion assistant effectively improves adhesion between a semiconductor substrate or a resist and an underlayer film.

As the solvent used for the resist underlayer film-forming composition of the present invention, a solvent capable of dissolving the above-mentioned solid contents may be used without particular limitations. Examples of the solvent include methylcellosolve acetate, ethylcellosolve acetate, propylene glycol, propylene glycol monomethyl ether, propylene glycol monoethyl ether, methyl isobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxy propionate, ethyl 3-ethoxy propionate, ethyl 3-methoxy propionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone, or in combination of two or more kinds thereof.

Hereinafter, the use of the resist underlayer film-forming composition of the present invention is described.

Here, onto a substrate used for the manufacture of a semiconductor device (for example, a silicon wafer substrate, a silicon/silicon-dioxide coated substrate, a silicon nitride substrate, a glass substrate, an ITO substrate, a polyimide substrate, or a low dielectric constant material (low-k material) coated substrate), the resist underlayer film-forming composition of the present invention is applied by appropriate application means, such as a spinner and a coater, followed by baking to form a resist underlayer film. The baking is performed under the conditions appropriately selected from heating temperatures of 80° C. to 250° C. and heating duration of 0.3 minute to 60 minutes. The baking temperature is preferably 150° C. to 250° C., and the heating duration is preferably 0.5 minute to 2 minutes. Here, the thickness of the underlayer film formed is, for example, 10 nm to 1,000 nm, 20 nm to 500 nm, 50 nm to 300 nm, or 100 nm to 200 nm.

Next, a photoresist layer, for example, is formed on the resist underlayer film. The photoresist layer can be formed by a well-known process, that is, the application of a solution of a photoresist composition onto the underlayer film, followed by baking. The film thickness of the photoresist layer is, for example, 50 nm to 10,000 nm, 100 nm to 2,000 nm, or 200 nm to 1,000 nm.

In the present invention, an organic underlayer film can be formed on a substrate, the resist underlayer film of the present invention can then be formed on the organic underlayer film, and furthermore, a photoresist can be coated on the resist underlayer film. This allows the pattern width of the photoresist to be narrower, and accordingly, even when the photoresist is applied thinly for the purpose of preventing pattern collapse, selecting an appropriate etching gas allows the substrate to be processed. For example, the use of a fluorine-based gas as an etching gas, which results in a significantly high etching rate for a photoresist, allows the resist underlayer film of the present invention to be processed. In contrast, the use of an oxygen-based gas as an etching gas, which results in a significantly high etching rate for the resist underlayer film of the present invention, allows an organic underlayer film to be processed. Furthermore, the use of a fluorine-based gas as an etching gas, which results in a significantly high etching rate for the organic underlayer film, allows a substrate to be processed.

The photoresist formed on the resist underlayer film of the present invention is not limited to a particular one as long as the photoresist is sensitive to light used for exposure. Negative and positive photoresists may both be used. Examples of the photoresist include a positive photoresist formed of a novolac resin and a 1,2-naphthoquinone diazide sulfonic acid ester; a chemically amplified photoresist formed of a binder having a group that is decomposed by acid to increase an alkali dissolution rate and a photoacid generator; a chemically amplified photoresist formed of a low molecular weight compound that is decomposed by acid to increase an alkali dissolution rate of the photoresist, an alkali-soluble binder, and a photoacid generator; and a chemically amplified photoresist formed of a binder having a group that is decomposed by acid to increase an alkali dissolution rate, a low molecular weight compound that is decomposed by acid to increase an alkali dissolution rate of the photoresist, and a photoacid generator. Examples of the photoresists include the trade name APEX-E, manufactured by Shipley, the trade name PAR710, manufactured by Sumitomo Chemical Company, Limited, and the trade name SEPR430, manufactured by Shin-Etsu Chemical Co., Ltd. Furthermore, examples of the photoresists include fluorine-atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, light exposure is performed through a predetermined mask. For the light exposure, for example, a KrF excimer laser (with a wavelength of 248 nm), an ArF excimer laser (with a wavelength of 193 nm), or an F2 excimer laser (with a wavelength of 157 nm) may be used. After the light exposure, post exposure bake may be performed, if necessary. The post exposure bake is performed under the conditions appropriately selected from heating temperatures of 70° C. to 150° C. and heating duration of 0.3 minute to 10 minutes.

In the present invention, a resist for electron beam lithography or a resist for EUV lithography may be used as a resist in place of a photoresist. Positive and negative electron beam resists may both be used. Examples of the electron beam resists include a chemically amplified resist formed of an acid generator and a binder having a group that is decomposed by acid to change an alkali dissolution rate; a chemically amplified resist formed of an alkali-soluble binder, an acid generator, and a low molecular weight compound that is decomposed by acid to change an alkali dissolution rate of the resist; a chemically amplified resist formed of an acid generator, a binder having a group that is decomposed by acid to change an alkali dissolution rate, and a low molecular weight compound that is decomposed by acid to change an alkali dissolution rate of the resist; a non-chemically amplified resist formed of a binder having a group that is decomposed by an electron beam to change an alkali dissolution rate; and a non-chemically amplified resist formed of a binder having a portion that is cut by an electron beam to change an alkali dissolution rate. Also, in the cases of using these electron beam resists, a resist pattern can be formed using an electron beam as an irradiation source in the same manner as in the case of using a photoresist.

As the EUV resist, methacrylate resin-based resists, methacrylate-polyhydroxystyrene hybrid resin-based resists, and polyhydroxystyrene resin-based resists may be used. Negative and positive resists may both be used as the EUV resist. Examples of the resist include a chemically amplified resist formed of a photoacid generator and a binder having a group decomposed by acid to change an alkali dissolution rate; a chemically amplified resist formed of an alkali-soluble binder, a photoacid generator, and a low molecular weight compound decomposed by acid to change the alkali dissolution rate of the resist; a chemically amplified resist formed of a photoacid generator, a binder having a group decomposed by acid to change an alkali dissolution rate of the resist, and a low molecular weight compound decomposed by acid to change the alkali dissolution rate of the resist; a non-chemically amplified resist formed of a binder having a group decomposed by EUV light to change an alkali dissolution rate; and a non-chemically amplified resist formed of a binder having a portion that is cut by EUV light to change an alkali dissolution rate.

Next, development is performed using a developing solution (for example, an alkaline developing solution). Thus, for example, in the case of using a positive photoresist, an exposed portion of the photoresist is removed to form a pattern of the photoresist.

Examples of the developing solution include alkaline solutions, such as: aqueous solutions of an alkali metal hydroxide, such as potassium hydroxide and sodium hydroxide; aqueous solutions of a quaternary ammonium hydroxide, such as tetramethyl ammonium hydroxide, tetraethyl ammonium hydroxide, and choline; and aqueous solutions of an amine, such as ethanolamine, propylamine, and ethylenediamine. Furthermore, a surfactant or other substances may be added to these developing solutions. The development conditions are appropriately selected from temperatures of 5° C. to 50° C. and duration of 10 seconds to 600 seconds.

Furthermore, in the present invention, an organic solvent may be used as a developing solution. After the light exposure, development is performed using a developing solution (a solvent). Thus, for example, in the case of using a positive photoresist, an unexposed portion of the photoresist is removed to form a pattern of the photoresist.

Examples of the developing solution include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxy propionate, ethyl 3-methoxy propionate, ethyl 3-ethoxy propionate, and propyl 3-methoxy propionate. Furthermore, a surfactant or other substances may be added to these developing solutions. The development conditions are appropriately selected from temperatures of 5° C. to 50° C. and duration of 10 seconds to 600 seconds.

Then, using the thus-formed pattern of the photoresist (upper layer) as a protective film, the photoresist underlayer film (intermediate layer) of the present invention is removed. Subsequently, using a film formed of the patterned photoresist and the patterned resist underlayer film (intermediate layer) of the present invention as protective films, an organic underlayer film (lower layer) is removed. Finally, using the patterned resist underlayer film (intermediate layer) of the present invention and the patterned organic underlayer film (lower layer) as protective films, a semiconductor substrate is processed.

First, a photoresist-removed portion of the resist underlayer film (intermediate layer) of the present invention is removed by dry etching to make a semiconductor substrate exposed. For the dry etching of the resist underlayer film of the present invention, gases, such as tetrafluoromethane ($CF_4$), parfluorocyclobutane ($C_4F_8$), parfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane may be used. For the dry etching of the resist underlayer film, a halogen-based gas is preferably used. With dry etching using a halogen-based gas, a photoresist formed of an organic substance is basically hard to remove. In contrast, the resist underlayer film of the present invention that contains many silicon atoms is promptly removed by a halogen-based gas. Thus, a reduction in the film thickness of the photoresist that is associated with the dry etching of the resist underlayer film can be suppressed. As a result, a thinner photoresist film can be used. The dry etching of the resist underlayer film is preferably performed using a fluorine-based gas. Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$).

After that, using a film formed of the patterned photoresist and the patterned resist underlayer film of the present invention as protective films, the organic underlayer film is removed. The dry etching of the organic underlayer film (lower layer) is preferably performed using an oxygen-based gas. This is because the resist underlayer film of the present invention that contains many silicon atoms is hard to remove by dry etching using an oxygen-based gas.

Finally, a semiconductor substrate is processed. The processing of the semiconductor substrate is preferably performed by dry etching using a fluorine-based gas.

Examples of the fluorine-based gas include tetrafluoromethane ($CF_4$), parfluorocyclobutane ($C_4F_8$), parfluoropropane ($C_3F_8$), trifluoromethane, and difluoromethane ($CH_2F_2$).

Furthermore, on the resist underlayer film of the present invention, an organic anti-reflective coating may be formed before the formation of a photoresist. An anti-reflective coating composition used for the anti-reflective coating is not limited to a particular one, and may be appropriately selected from various anti-reflective coating compositions that have been commonly used for lithography process. Furthermore, the anti-reflective coating may be formed using a common method, for example, application with a spinner or a coater and baking.

The substrate to which the resist underlayer film-forming composition of the present invention is applied may have an organic or inorganic anti-reflective coating formed thereon by a CVD process or the like, and furthermore, on the anti-reflective coating, an underlayer film of the present invention may be formed.

Sometimes, depending on the wavelength of light used in a lithography process, the resist underlayer film formed from the resist underlayer film-forming composition of the present invention absorbs the light. In this case, the resist underlayer film can function as an anti-reflective coating having the effect of preventing light reflected from a substrate. Furthermore, the underlayer film of the present invention can be used as, for example, a layer for preventing the interaction between a substrate and a photoresist; a layer having the function of preventing a material used for a photoresist or a substance produced at the time of exposing a photoresist to light from having an adverse effect on a substrate; a layer having the function of preventing a substance produced from a substrate at the time of heating and baking from diffusing to a photoresist serving as an upper layer; a barrier layer for reducing the effect of poisoning a photoresist layer by a dielectric layer on a semiconductor substrate; or the like.

Furthermore, the resist underlayer film formed from the resist underlayer film-forming composition can be applied to a substrate having via holes formed therein for use in the dual-damascene process, and can be used as an embedding material to fill up the holes. Furthermore, the resist underlayer film can be used as a flattening material to make the surface of a semiconductor substrate having projections and depressions flat.

Furthermore, the resist underlayer film serving as an underlayer film for EUV resist can be used for the purposes mentioned below, besides as a hard mask. That is, the above-mentioned resist underlayer film-forming composition can be used for an anti-reflective underlayer coating for EUV resist that can prevent exposure light undesirable for EUV exposure (wavelength of 13.5 nm), such as UV and DUV mentioned above (ArF laser, KrF laser), from reflecting from a substrate or an interface, without intermixing with the EUV resist. The resist underlayer film can efficiently prevent the reflection at the underlayer of EUV resist. When used as an underlayer film for EUV resist, the resist underlayer film can be processed in the same manner as for an underlayer film for photoresists.

EXAMPLES

Synthesis Example 1

25.37 g (70% by mole) of tetraethoxysilane, 4.46 g (10% by mole) of 5-(bicycloheptenyl)triethoxysilane, 6.20 g (20% by mole) of methyltriethoxysilane, and 54.06 g of acetone were introduced into a 300-ml flask, and, while the resultant mixed solution was stirred with a magnetic stirrer, 11.60 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-1) and had a weight average molecular weight of Mw 1,500 by GPC in terms of polystyrene.

Synthesis Example 2

24.95 g (70% by mole) of tetraethoxysilane, 8.77 g (20% by mole) of 5-(bicycloheptenyl)triethoxysilane, 3.05 g (10% by mole) of methyltriethoxysilane, and 55.16 g of acetone were introduced into a 300-ml flask, and, while the resultant mixed solution was stirred with a magnetic stirrer, 11.41 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-1) and had a weight average molecular weight of Mw 1,500 by GPC in terms of polystyrene.

Synthesis Example 3

23.39 g (70% by mole) of tetraethoxysilane, 12.33 g (30% by mole) of 5-(bicycloheptenyl)triethoxysilane, and 53.58 g of acetone were introduced into a 300-ml flask, and, while the resultant mixed solution was stirred with a magnetic stirrer, 10.69 g of 0.01 mol/I hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproduct, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-2) and had a weight average molecular weight of Mw 1,500 by GPC in terms of polystyrene.

Synthesis Example 4

23.91 g (70% by mole) of tetraethoxysilane, 5.88 g (10% by mole) of t-butyl-5-(triethoxysilyl)bicyclo[2.2.1]heptane-2-carboxylate, 5.85 g (20% by mole) of methyltriethoxysilane, and 53.44 g of acetone were introduced into a 300-ml flask, and, while the resultant mixed solution was stirred with a magnetic stirrer, 10.93 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-3) and had a weight average molecular weight of Mw 1,500 by GPC in terms of polystyrene.

Synthesis Example 5

23.98 g (70% by mole) of tetraethoxysilane, 1.63 g (5% by mole) of phenyltrimethoxysilane, 2.93 g (10% by mole) of methyltriethoxysilane, 4.22 g (10% by mole) of 5-(bicycloheptenyl)triethoxysilane, 2.85 g (5% by mole) of phenylsulfonylpropyltriethoxysilane, and 53.42 g of acetone were introduced into a 300-ml flask, and, while the resultant mixed solution was stirred with a magnetic stirrer, 10.97 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-4) and had a weight average molecular weight of Mw 1,500 by GPC in terms of polystyrene.

Synthesis Example 6

23.29 g (70% by mole) of tetraethoxysilane, 1.58 g (5% by mole) of phenyltrimethoxysilane, 2.85 g (10% by mole) of methyltriethoxysilane, 5.25 g (10% by mole) of 5-(triethoxysilyl)hexahydro-4,7-methanoisobenzofuran-1,3-dione, 2.77 g (5% by mole) of phenylsulfonylpropyltriethoxysilane, and 53.61 g of acetone were introduced into a 300-ml flask, and, while the resultant mixed solution was stirred with a magnetic stirrer, 10.65 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-5) and had a weight average molecular weight of Mw 1,500 by GPC in terms of polystyrene.

Synthesis Example 7

24.90 g (70% by mole) of tetraethoxysilane, 1.69 g (5% by mole) of phenyltrimethoxysilane, 1.52 g (5% by mole) of methyltriethoxysilane, 4.38 g (10% by mole) of 5-(bicycloheptenyl)triethoxysilane, 2.07 g (5% by mole) of methoxybenzyltrimethoxysilane, 2.95 g (5% by mole) of phenylsulfonylpropyltriethoxysilane, and 53.17 g of acetone were introduced into a 300-ml flask, and, while the resultant mixed solution was stirred with a magnetic stirrer, 11.39 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-6) and had a weight average molecular weight of Mw 1,500 by GPC in terms of polystyrene.

Synthesis Example 8

24.15 g (70% by mole) of tetraethoxysilane, 1.64 g (5% by mole) of phenyltrimethoxysilane, 1.48 g (5% by mole) of methyltriethoxysilane, 5.44 g (10% by mole) of 5-(triethoxysilyl)hexahydro-4,7-methanoisobenzofuran-1,3-dione, 2.01 g (5% by mole) of methoxybenzyltrimethoxysilane, 2.87 g (5% by mole) of phenylsulfonylpropyltriethoxysilane, and 53.37 g of acetone were introduced into a 300-ml flask, and, while the resultant mixed solution was stirred with a magnetic stirrer, 11.04 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-7) and had a weight average molecular weight of Mw 1,500 by GPC in terms of polystyrene.

Synthesis Example 9

23.05 g (70% by mole) of tetraethoxysilane, 1.573 g (5% by mole) of phenyltrimethoxysilane, 4.37 g (10% by mole) of 4-(2-(triethoxysilyl)ethyl)dihydrofuran-2(3H)-one, 4.05 g (10% by mole) of 5-(bicycloheptenyl)triethoxysilane, 2.74 g (5% by mole) of phenylsulfonylpropyltriethoxysilane, and 53.68 g of acetone were introduced into a 300-ml flask, and, while the resultant mixed solution was stirred with a magnetic stirrer, 10.54 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-8) and had a weight average molecular weight of Mw 1,500 by GPC in terms of polystyrene.

Synthesis Example 10

22.42 g (70% by mole) of tetraethoxysilane, 1.52 g (5% by mole) of phenyltrimethoxysilane, 4.25 g (10% by mole) of 4-(2-(triethoxysilyl)ethyl)dihydrofuran-2(3H)-one, 5.05 g (10% by mole) of 5-(triethoxysilyl)hexahydro-4,7-methanoisobenzofuran-1,3-dione, 2.66 g (5% by mole) of phenylsulfonylpropyltriethoxysilane, and 53.85 g of acetone were introduced into a 300-ml flask, and, while the resultant mixed solution was stirred with a magnetic stirrer, 10.25 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-9) and had a weight average molecular weight of Mw 1,500 by GPC in terms of polystyrene.

Synthesis Example 11

23.37 g (70% by mole) of tetraethoxysilane, 0.95 g (3% by mole) of phenyltrimethoxysilane, 1.14 g (4% by mole) of methyltriethoxysilane, 2.22 g (5% by mole) of 4-(2-(triethoxysilyl)ethyl)dihydrofuran-2(3H)-one, 5.26 g (10% by mole) of 5-(triethoxysilyl)hexahydro-4,7-methanoisobenzofuran-1,3-dione, 2.78 g (5% by mole) of phenylsulfonylpropyltriethoxysilane, 1.88 g (3% by mole) of methoxyphenylsulfonylpropyltriethoxysilane, and 53.59 g of acetone were introduced into a 300-ml flask, and, while the resultant mixed solution was stirred with a magnetic stirrer, 10.69 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-10) and had a weight average molecular weight of Mw 1,500 by GPC in terms of polystyrene.

Synthesis Example 12

23.24 g (70% by mole) of tetraethoxysilane, 0.95 g (3% by mole) of phenyltrimethoxysilane, 1.14 g (4% by mole) of methyltriethoxysilane, 2.43 g (5% by mole) of 3-(3-(triethoxysilyl)propyl)dihydrofuran-2,5-dione, 5.24 g (10% by mole) of 5-(triethoxysilyl)hexahydro-4,7-methanoisobenzofuran-1,3-dione, 2.76 g (5% by mole) of phenylsulfonylpropyltriethoxysilane, 1.87 g (3% by mole) of methoxyphenylsulfonylpropyltriethoxysilane, and 53.62 g of acetone were introduced into a 300-ml flask, and, while the resultant mixed solution was stirred with a magnetic stirrer, 10.63 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-11) and had a weight average molecular weight of Mw 1,500 by GPC in terms of polystyrene.

Synthesis Example 13

23.28 g (70% by mole) of tetraethoxysilane, 1.58 g (5% by mole) of phenyltrimethoxysilane, 5.27 g (10% by mole) of 5-(triethoxysilyl)hexahydro-4,7-epoxyisobenzofuran-1,3-dione, 2.85 g (10% by mole) of methyltriethoxysilane, 2.77 g (5% by mole) of phenylsulfonylpropyltriethoxysilane, and 53.61 g of acetone were introduced into a 300-ml flask, and, while the resultant mixed solution was stirred with a magnetic stirrer, 10.64 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-12) and had a weight average molecular weight of Mw 1,500 by GPC in terms of polystyrene.

Synthesis Example 14

23.41 g (70% by mole) of tetraethoxysilane, 1.59 g (5% by mole) of phenyltrimethoxysilane, 5.08 g (10% by mole) of 5-(triethoxysilyl)hexahydro-4,7-epoxyisobenzofuran-1(3H)-one, 2.86 g (10% by mole) of methyltriethoxysilane, 2.78 g (5% by mole) of phenylsulfonylpropyltriethoxysilane, and 53.60 g of acetone were introduced into a 300-ml flask, and, while the resultant mixed solution was stirred with a magnetic stirrer, 10.70 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-13) and had a weight average molecular weight of Mw 1,500 by GPC in terms of polystyrene.

Synthesis Example 15

23.16 g (70% by mole) of tetraethoxysilane, 1.57 g (5% by mole) of phenyltrimethoxysilane, 5.45 g (10% by mole) of 2-hydroxy-5-(triethoxysilyl)hexahydro-1H-4,7-methanoisoindole-1,3(2H)-dione, 2.83 g (10% by mole) of methyltriethoxysilane, 2.75 g (5% by mole) of phenylsulfonylpropyltriethoxysilane, and 53.65 g of acetone were introduced into a 300-ml flask, and, while the resultant mixed solution was stirred with a magnetic stirrer, 10.59 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-14) and had a weight average molecular weight of Mw 1,500 by GPC in terms of polystyrene.

Synthesis Example 16

23.29 g (70% by mole) of tetraethoxysilane, 1.58 g (5% by mole) of phenyltrimethoxysilane, 5.25 g (10% by mole) of 5-(triethoxysilyl)dihydro-2'H-spiro[bicyclo[2.2.1]heptane-2,3'-furan]-2'-one, 2.85 g (10% by mole) of methyltriethoxysilane, 2.77 g (5% by mole) of phenylsulfonylpropyltriethoxysilane, and 53.61 g of acetone were introduced into a 300-ml flask, and, while the resultant mixed solution was stirred with a magnetic stirrer, 10.65 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-15) and had a weight average molecular weight of Mw 1,500 by GPC in terms of polystyrene.

Synthesis Example 17

23.92 g (70% by mole) of tetraethoxysilane, 1.63 g (5% by mole) of phenyltrimethoxysilane, 4.30 g (10% by mole)

of 4-((triethoxysilyl)methyl)dihydrofuran-2(3H)-one, 2.93 g (10% by mole) of methyltriethoxysilane, 2.84 g (5% by mole) of phenylsulfonylpropyltriethoxysilane, and 53.44 g of acetone were introduced into a 300-ml flask, and, while the resultant mixed solution was stirred with a magnetic stirrer, 10.94 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-16) and had a weight average molecular weight of Mw 1,500 by GPC in terms of polystyrene.

Synthesis Example 18

23.79 g (70% by mole) of tetraethoxysilane, 1.62 g (5% by mole) of phenyltrimethoxysilane, 4.51 g (10% by mole) of 3-((triethoxysilyl)methyl)dihydrofuran-2,5-dione, 2.83 g (10% by mole) of methyltriethoxysilane, 2.83 g (5% by mole) of phenylsulfonylpropyltriethoxysilane, and 53.47 g of acetone were introduced into a 300-ml flask, and, while the resultant mixed solution was stirred with a magnetic stirrer, 10.88 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-17) and had a weight average molecular weight of Mw 1,500 by GPC in terms of polystyrene.

Synthesis Example 19

23.29 g (70% by mole) of tetraethoxysilane, 1.58 g (5% by mole) of phenyltrimethoxysilane, 5.25 g (10% by mole) of 5-(triethoxysilyl)hexahydro-4,7-methanoisobenzofuran-1,3-dione (Exo), 2.85 g (10% by mole) of methyltriethoxysilane, 2.77 g (5% by mole) of phenylsulfonylpropyltriethoxysilane, and 53.61 g of acetone were introduced into a 300-ml flask, and, while the resultant mixed solution was stirred with a magnetic stirrer, 10.65 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-18) and had a weight average molecular weight of Mw 1,500 by GPC in terms of polystyrene.

Synthesis Example 20

23.29 g (70% by mole) of tetraethoxysilane, 1.58 g (5% by mole) of phenyltrimethoxysilane, 5.25 g (10% by mole) of 5-(triethoxysilyl)hexahydro-4,7-methanoisobenzofuran-1,3-dione (Endo), 2.85 g (10% by mole) of methyltriethoxysilane, 2.77 g (5% by mole) of phenylsulfonylpropyltriethoxysilane, and 53.61 g of acetone were introduced into a 300-ml flask, and, while the resultant mixed solution was stirred with a magnetic stirrer, 10.65 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-19) and had a weight average molecular weight of Mw 1,500 by GPC in terms of polystyrene.

Synthesis Example 21

23.29 g (70% by mole) of tetraethoxysilane, 1.58 g (5% by mole) of phenyltrimethoxysilane, 5.25 g (10% by mole) of 5-(triethoxysilyl)hexahydro-4,7-methanoisobenzofuran-1,3-dione (Endo, Exo isomer), 2.85 g (10% by mole) of methyltriethoxysilane, 2.77 g (5% by mole) of phenylsulfonylpropyltriethoxysilane, and 53.61 g of acetone were introduced into a 300-ml flask, and, while the resultant mixed solution was stirred with a magnetic stirrer, 10.65 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-20) and had a weight average molecular weight of Mw 1,500 by GPC in terms of polystyrene.

Synthesis Example 22

25.70 g (70% by mole) of tetraethoxysilane, 1.75 g (5% by mole) of phenyltrimethoxysilane, 7.86 g (25% by mole) of methyltriethoxysilane, and 53.61 g of acetone were introduced into a 300-ml flask, and, while the resultant mixed solution was stirred with a magnetic stirrer, 11.75 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (22-1) and had a weight average molecular weight of Mw 1,500 by GPC in terms of polystyrene.

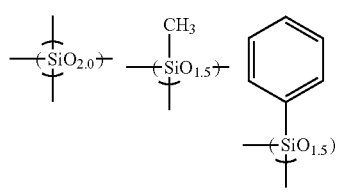

Formula (22-1)

Synthesis Example 23

25.70 g (70% by mole) of tetraethoxysilane, 4.64 g (10% by mole) of 5-(triethoxysilyl)-2-azabicyclo[2.2.1]heptane-3-one, 6.06 g (20% by mole) of methyltriethoxysilane, and 53.20 g of acetone were introduced into a 300-ml flask, and, while the resultant mixed solution was stirred with a magnetic stirrer, 11.33 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-21) and had a weight average molecular weight of Mw 1,500 by GPC in terms of polystyrene.

Synthesis Example 24

22.93 g (70% by mole) of tetraethoxysilane, 12.88 g (30% by mole) of 5-(triethoxysilyl)-2-azabicyclo[2.2.1]heptane-3-one, and 53.71 g of acetone were introduced into a 300-ml flask, and, while the resultant mixed solution was stirred with a magnetic stirrer, 10.48 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (2-22) and had a weight average molecular weight of Mw 1,500 by GPC in terms of polystyrene.

Comparative Synthesis Example 1

25.81 g (70% by mole) of tetraethoxysilane, 9.47 g (30% by mole) of methyltriethoxysilane, and 52.92 g of acetone were introduced into a 300-ml flask, and, while the resultant mixed solution was stirred with a magnetic stirrer, 11.80 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction byproducts, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/propylene glycol monoethyl ether 20/80. The obtained polymer corresponded to Formula (3-1) and had a weight average molecular weight of Mw 1,500 by GPC in terms of polystyrene.

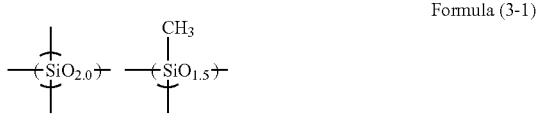

Formula (3-1)

Comparative Synthesis Example 2

25.41 g (70% by mole) of tetraethoxysilane, 6.21 g (20% by mole) of methyltriethoxysilane, 3.73 g (10% by mole) of 5-(bicycloheptenyl)trimethoxysilane, and 53.03 g of acetone were introduced into a 300-ml flask, and, while the resultant mixed solution was stirred with a magnetic stirrer, 11.62 g of 0.01 mol/l hydrochloric acid was added dropwise to the mixed solution. After the completion of the addition, the flask was transferred into an oil bath adjusted to 85° C., while being heated to reflux, the reaction was effected for 240 minutes. Then, the reaction solution was cooled down to room temperature, and to the reaction solution, 70.00 g of propylene glycol monomethyl ether acetate was added, and methanol and ethanol as reaction by-products, acetone, water, and hydrochloric acid were distilled off under reduced pressure, and the resultant reaction mixture solution was condensed to obtain a hydrolysis-condensation product (polymer) propylene glycol monomethyl ether acetate solution. To the obtained solution, propylene glycol monoethyl ether was added to adjust the resultant solution so as to contain solid residues of 20% by weight at 140° C. with a solvent ratio of propylene glycol monomethyl ether acetate/ propylene glycol monoethyl ether 20/80. The obtained polymer corresponded to Formula (3-2) and had a weight average molecular weight of Mw 1,700 by GPC in terms of polystyrene.

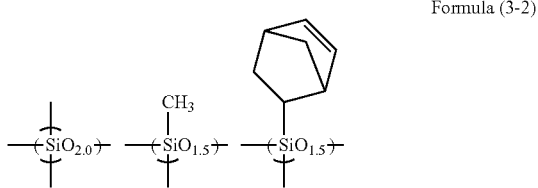

Formula (3-2)

(Preparation of Si-Containing Resist Underlayer Film)

The silicon-containing polymer obtained in Synthesis Example 1 was mixed with an acid, a curing catalyst, an additive, a solvent, and water in ratios shown in Table 1. The mixture was filtered with a 0.1-μm fluororesin filter to prepare solutions of the resist underlayer film-forming compositions. The blending ratios of the polymers in Table 1 and Table 2 indicate not the blending amounts of the polymer solutions, but the blending amounts of the polymers themselves.

In Table 1 and Table 2, maleic acid is abbreviated as MA; benzyltriethylammonium chloride is abbreviated as BTEAC; N-(3-triethoxysilylpropyl)-4,5-dihydroimidazole is abbreviated as IMIDTEOS; triphenylsulfonium nitrate is abbreviated as TPSNO3; monotriphenylsulfonium maleate is abbreviated as TPSMA; triphenylsulfonium trifluoroacetate is abbreviated as TPSTFA; triphenylsulfonium chloride is abbreviated as TPSCl; triphenylsulfonium camphorsulfonate is abbreviated as TPSCS; triphenylsulfonium trifluoromethanesulfonate is abbreviated as TPSTf; triphenylsulfonium nonafluorobutanesulfonate is abbreviated as TPSNf; triphenylsulfonium adamantanecarboxy-1,1,2-trifluorobutanesulfonate is abbreviated as TPSAdTF; dihydroxyphenylphenylsulfonium p-toluenesulfonate is DHTPPSpTS; bisphenylsulfone is abbreviated as BPS; propylene glycol monomethyl ether acetate is abbreviated as PGMEA; propylene glycol monoethyl ether is abbreviated as PGEE; propylene glycol monomethyl ether is abbreviated as PGME; 5-norbornene-2,3-dicarboxylic anhydride is abbreviated as NorAn; cis-4-cyclohexene-1,2-dicarboxylic anhydride is abbreviated as HexAn; and 3,6-epoxy-1,2,3,6-tetrahydrophthalic anhydride is abbreviated as EpoPhAn. As the water, ultrapure water was used. Each blending amount is expressed in part by mass.

TABLE 1

| | Si polymer | Acid | Curing catalyst | Additive | Solvent | | | |
|---|---|---|---|---|---|---|---|---|
| Example 1 | Synthesis Example 1 | MA | TPSMA | TPSCS | PGME | PGEE | PGMEA | Water |
| (part by mass) | 2 | 0.02 | 0.06 | 0.1 | 15 | 65 | 5 | 15 |
| Example 2 | Synthesis Example 1 | MA | TPSNO3 | TPSAdTf | PGME | PGEE | PGMEA | Water |
| (part by mass) | 2 | 0.02 | 0.006 | 0.1 | 15 | 65 | 5 | 15 |
| Example 3 | Synthesis Example 1 | MA | TPSCl | TPSNf | PGME | PGEE | PGMEA | Water |
| (part by mass) | 2 | 0.02 | 0.006 | 0.1 | 15 | 65 | 5 | 15 |
| Example 4 | Synthesis Example 2 | MA | IMIDTEOS | TPSTf | PGME | PGEE | PGMEA | Water |
| (part by mass) | 2 | 0.02 | 0.006 | 0.1 | 15 | 65 | 5 | 15 |
| Example 5 | Synthesis Example 2 | MA | BTEAC | DHTPPSpTS | PGME | PGEE | PGMEA | Water |
| (part by mass) | 2 | 0.02 | 0.006 | 0.1 | 15 | 65 | 5 | 15 |
| Example 6 | Synthesis Example 2 | MA | TPSTFA | TPSAdTf | PGME | PGEE | PGMEA | Water |
| (part by mass) | 2 | 0.02 | 0.06 | 0.1 | 15 | 65 | 5 | 15 |
| Example 7 | Synthesis Example 3 | MA | TPSCl | TPSCS | PGME | PGEE | PGMEA | Water |
| (part by mass) | 2 | 0.02 | 0.006 | 0.3 | 15 | 65 | 5 | 15 |
| Example 8 | Synthesis Example 3 | MA | TPSNO3 | TPSAdTf | PGME | PGEE | PGMEA | Water |
| (part by mass) | 2 | 0.02 | 0.006 | 0.1 | 15 | 65 | 5 | 15 |
| Example 9 | Synthesis Example 3 | MA | TPSNO3 | BPS | PGME | PGEE | PGMEA | Water |
| (part by mass) | 2 | 0.02 | 0.006 | 0.1 | 15 | 65 | 5 | 15 |

TABLE 2

| | Si polymer | Acid | Curing catalyst | Additive | Solvent | | | |
|---|---|---|---|---|---|---|---|---|
| Example 10 | Synthesis Example 4 | MA | TPSNO3 | TPSCS | PGME | PGEE | PGMEA | Water |
| (part by mass) | 2 | 0.02 | 0.006 | 0.1 | 15 | 65 | 5 | 15 |
| Example 11 | Synthesis Example 5 | MA | IMIDTEOS | TPSAdTf | PGME | PGEE | PGMEA | Water |
| (part by mass) | 2 | 0.02 | 0.006 | 0.1 | 15 | 65 | 5 | 15 |
| Example 12 | Synthesis Example 6 | MA | TPSNO3 | | PGME | PGEE | PGMEA | Water |
| (part by mass) | 2 | 0.02 | 0.006 | | 15 | 65 | 5 | 15 |
| Example 13 | Synthesis Example 7 | MA | TPSNO3 | TPSCS | PGME | PGEE | PGMEA | Water |
| (part by mass) | 2 | 0.02 | 0.006 | 0.1 | 15 | 65 | 5 | 15 |
| Example 14 | Synthesis Example 8 | MA | TPSNO3 | BPS | PGME | PGEE | PGMEA | Water |
| (part by mass) | 2 | 0.02 | 0.006 | 0.1 | 15 | 65 | 5 | 15 |
| Example 15 | Synthesis Example 9 | MA | TPSNO3 | TPSNf | PGME | PGEE | PGMEA | Water |
| (part by mass) | 2 | 0.02 | 0.006 | 0.1 | 15 | 65 | 5 | 15 |
| Example 16 | Synthesis Example 10 | MA | TPSNO3 | TPSCS | PGME | PGEE | PGMEA | Water |
| (part by mass) | 2 | 0.02 | 0.006 | 0.1 | 15 | 65 | 5 | 15 |
| Example 17 | Synthesis Example 11 | MA | IMIDTEOS | | PGME | PGEE | PGMEA | Water |
| (part by mass) | 2 | 0.02 | 0.006 | | 15 | 65 | 5 | 15 |
| Example 18 | Synthesis Example 12 | MA | TPSNO3 | TPSCS | PGME | PGEE | PGMEA | Water |
| (part by mass) | 2 | 0.02 | 0.006 | 0.1 | 15 | 65 | 5 | 15 |
| Comparative Example 1 | Comparative Synthesis Example 1 | MA | TPSMA | TPSCS | PGME | PGEE | PGMEA | Water |
| (part by mass) | 2 | 0.02 | 0.06 | 0.1 | 15 | 65 | 5 | 15 |
| Comparative Example 2 | Comparative Synthesis Example 2 | MA | TPSMA | TPSCS | PGME | PGEE | PGMEA | Water |
| (part by mass) | 2 | 0.02 | 0.06 | 0.1 | 15 | 65 | 5 | 15 |

TABLE 3

| | Si polymer | Acid | Curing catalyst | Additive | Solvent | | | |
|---|---|---|---|---|---|---|---|---|
| Example 19 | Synthesis Example 13 | MA | TPSMA | TPSCS | PGME | PGEE | PGMEA | Water |
| (part by mass) | 2 | 0.06 | 0.02 | 0.1 | 15 | 65 | 5 | 15 |
| Example 20 | Synthesis Example 14 | MA | IMIDTEOS | TPSTf | PGME | PGEE | PGMEA | Water |
| (part by mass) | 2 | 0.02 | 0.006 | 0.06 | 15 | 65 | 5 | 15 |
| Example 21 | Synthesis Example 15 | MA | TPSNO3 | TPSNf | PGME | PGEE | PGMEA | Water |
| (part by mass) | 2 | 0.02 | 0.012 | 0.06 | 15 | 65 | 5 | 15 |
| Example 22 | Synthesis Example 16 | MA | TPSTFA | TPSAdTf | PGME | PGEE | PGMEA | Water |
| (part by mass) | 2 | 0.02 | 0.06 | 0.1 | 15 | 65 | 5 | 15 |
| Example 23 | Synthesis Example 17 | MA | IMIDTEOS | | PGME | PGEE | PGMEA | Water |
| (part by mass) | 2 | 0.02 | 0.006 | | 15 | 65 | 5 | 15 |
| Example 24 | Synthesis Example 18 | MA | TPSC1 | TPSAdTf | PGME | PGEE | PGMEA | Water |
| (part by mass) | 2 | 0.02 | 0.006 | 0.1 | 15 | 65 | 5 | 15 |
| Example 25 | Synthesis Example 19 | MA | TPSMA | TPSTf | PGME | PGEE | PGMEA | Water |
| (part by mass) | 2 | 0.02 | 0.006 | 0.1 | 15 | 65 | 5 | 15 |
| Example 26 | Synthesis Example 20 | MA | IMIDTEOS | TPSNf | PGME | PGEE | PGMEA | Water |
| (part by mass) | 2 | 0.02 | 0.006 | 0.1 | 15 | 65 | 5 | 15 |
| Example 27 | Synthesis Example 21 | MA | TPSTFA | TPSAdTf | PGME | PGEE | PGMEA | Water |
| (part by mass) | 2 | 0.06 | 0.02 | 0.1 | 15 | 65 | 5 | 15 |
| Example 28 | Synthesis Example 22 | MA | IMIDTEOS | NorAn | PGME | PGEE | PGMEA | Water |
| (part by mass) | 2 | 0.06 | 0.006 | 0.1 | 15 | 65 | 5 | 15 |
| Example 29 | Synthesis Example 22 | MA | IMIDTEOS | HexAn | PGME | PGEE | PGMEA | Water |
| (part by mass) | 2 | 0.06 | 0.006 | 0.1 | 15 | 65 | 5 | 15 |
| Example 30 | Synthesis Example 22 | MA | IMIDTEOS | EpoPhAn | PGME | PGEE | PGMEA | Water |
| (part by mass) | 2 | 0.06 | 0.006 | 0.1 | 15 | 65 | 5 | 15 |
| Example 31 | Synthesis Example 23 | MA | TPSTFA | TPSAdTf | PGME | PGEE | PGMEA | Water |
| (part by mass) | 2 | 0.06 | 0.06 | 0.1 | 15 | 65 | 5 | 15 |
| Example 32 | Synthesis Example 24 | MA | TPSNO3 | TPSCS | PGME | PGEE | PGMEA | Water |
| (part by mass) | 2 | 0.06 | 0.06 | 0.1 | 15 | 65 | 5 | 15 |

(Preparation of Organic Resist Underlayer Film)

Under an atmosphere of nitrogen, carbazole (6.69 g, 0.040 mol, manufactured by Tokyo Chemical Industry Co., Ltd.), 9-fluorenone (7.28 g, 0.040 mol, manufactured by Tokyo Chemical Industry Co., Ltd.), and p-toluenesulfonic acid monohydrate (0.76 g, 0.0040 mol, manufactured by Tokyo Chemical Industry Co., Ltd.) were introduced into a 100-ml four-neck flask, and 1,4-dioxane (6.69 g, manufactured by KANTO) CHEMICAL CO., INC.) was charged therein and stirred. The resultant mixture was dissolved with the temperature increased to 100° C. to initiate polymerization. After 24 hours, the product was left cool to 60° C., and then, chloroform (34 g, manufactured by KANTO CHEMICAL CO., INC.) was added to dilute the product, and the resultant product was reprecipitated in methanol (168 g, manufactured by KANTO CHEMICAL CO., INC.). The obtained precipitate was filtered and dried with a vacuum drier at 80° C. for 24 hours, yielding 9.37 g of a polymer (Formula (4-1), hereinafter abbreviated as PCzFL) as a target product.

Formula (4-1)

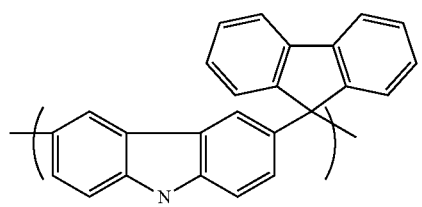

The measurement results of ¹H-NMR of PCzFL were as follows.

¹H-NMR (400 MHz, DMSO-d₆): δ7.03-7.55 (br, 12H), δ7.61-8.10 (br, 4H), δ11.18 (br, 1H)

The weight average molecular weight Mw of PCzFL measured by GPC in terms of polystyrene was 2,800, and the degree of poly-distribution Mw/Mn was 1.77.

20 g of the obtained resin was mixed with 3.0 g of tetramethoxymethyl glycoluril (the trade name Powderlink 1174, manufactured by Mitsui Cytec Ltd.) as a crosslinking agent, 0.30 g of pyridinium p-toluenesulfonate as a catalyst, and 0.06 g of MEGAFAC R-30 (the trade name, manufactured by DIC Corporation) as a surfactant. The mixture was dissolved in 88 g of propylene glycol monomethyl ether acetate to form a solution. The solution was then filtered with a polyethylene microfilter having a pore size of 0.10 µm, and further filtered with a polyethylene microfilter having a pore size of 0.05 µm to prepare a solution of an organic resist underlayer film (Layer A)-forming composition used for a lithography process using a multilayer film.

(Optical Constant Measurement)

Each of the Si-containing resist underlayer film-forming compositions prepared in Examples 1 to 10 and Comparative Example 1 was applied onto a silicon wafer by a spinner. The coated wafers each were heated on a hot plate at 200° C. for 1 minute to form the respective Si-containing resist underlayer films (with a film thickness of 0.05 µm). Then, the refractive indexes (n value) and the optical absorption coefficients (also referred to as k value or attenuation coefficient) at wavelengths of 193 nm of these resist underlayer films were measured using a spectroscopic ellipsometer (VUV-VASE VU-302, manufactured by J.A. Woollam Co.).

(Measurement of Dry Etching Rate)

For the measurement of dry etching rate, the following etcher and etching gas were used.

ES401 (manufactured by NIPPON SCIENTIFIC Co., Ltd.): CF₄

RIE-10NR (manufactured by SAMCO INC.): O₂

Each solution of the Si-containing resist underlayer film-forming compositions prepared in Examples 1 to 10 and Comparative Example 1 was applied onto a silicon wafer using a spinner. The applied solutions were heated on a hot plate at 240° C. for 1 minute to form Si-containing resist underlayer films (having a film thickness of 0.08 µm (for the measurement of the etching rate using CF₄ gas) or having a film thickness of 0.05 µm (for the measurement of the etching rate using 02 gas)). Furthermore, in the same manner, an organic underlayer film-forming composition was applied onto a silicon wafer using a spinner to form a coating film (having a film thickness of 0.20 µm). Using 02 gas as an etching gas, the dry etching rate of the organic underlayer films was measured, and compared with the dry etching rates of the Si-containing resist underlayer films of Examples 1 to 10 and Comparative Example 1. The dry etching rate using the fluorine-based gas was expressed in (nm/min). Furthermore, the ratio of the etching rates using the oxygen-based gas was calculated using (dry etching rate of Si-containing resist underlayer film)/(dry etching rate of organic underlayer film).

(Evaluation of Resist Patterning)

The organic underlayer film (Layer A)-forming composition containing the structure of Formula (4-1) above was applied onto a silicon wafer, and the applied organic underlayer film was baked on a hot plate at 400° C. for 60 seconds to obtain an organic underlayer film (Layer A) having a film thickness of 200 nm. Each of the Si-containing resist underlayer film (Layer B)-forming compositions obtained in Examples 1 to 10 and Comparative Example 1 was applied onto Layer A, followed by baking on a hot plate at 400° C. for 60 seconds to obtain a Si-containing resist underlayer film (Layer B). The Si-containing resist underlayer films (Layers B) had a film thickness of 45 nm.

Onto each of Layers B, a commercially available photoresist solution (trade name: AR2772, manufactured by JSR Corporation) was applied by a spinner, followed by baking on a hot plate at 110° C. for 60 seconds to form a photoresist film (Layer C) having a film thickness of 120 nm. Resist patterning was performed using an ArF exposure apparatus, S-307E, manufactured by Nikon Corporation (wavelength: 193 nm, NA, σ: 0.85, 0.93/0.85 (Dipole) immersion liquid: water). The photoresist film was exposed through a mask that allows the formation of a so-called line-and-space (dense line) in which the line width and the width between the lines of the photoresist are each 0.062 µm after development as a target.

After the exposure, the photoresist film was baked on a hot plate at 110° C. for 60 seconds, and cooled down, then developed using a tetramethylammonium hydroxide aqueous solution (a developing solution) having a concentration of 2.38% by mass for 60 seconds through the single puddle development process. In the skirt shape of the resist pattern after lithography, a rectangular line was evaluated as straight, and a line having wider bottom was evaluated as footing.

Table 3 shows refractive indexes at 193 nm, optical absorption coefficients, fluorine gas etching rates, oxygen-based gas resistances, and the results of skirt shape of resist by the lithography evaluation.

TABLE 4

| | Refractive index | Optical absorption coefficient | Fluorine-based gas etching rate (nm/min) | Oxygen-based gas resistance vs. organic underlayer film | Skirt shape of resist |
|---|---|---|---|---|---|
| Example 1 | 1.56 | 0.08 | 23 | 0.02 | Good |
| Example 2 | 1.56 | 0.08 | 23 | 0.02 | Good |
| Example 3 | 1.56 | 0.08 | 23 | 0.02 | Good |
| Example 4 | 1.57 | 0.08 | 23 | 0.02 | Good |
| Example 5 | 1.57 | 0.08 | 23 | 0.02 | Good |
| Example 6 | 1.57 | 0.08 | 23 | 0.02 | Good |
| Example 7 | 1.58 | 0.09 | 24 | 0.03 | Good |
| Example 8 | 1.58 | 0.09 | 24 | 0.03 | Good |
| Example 9 | 1.58 | 0.09 | 24 | 0.03 | Good |
| Example 10 | 1.57 | 0.08 | 23 | 0.02 | Good |
| Comparative Example 1 | 1.55 | 0.01 | 22 | 0.02 | Good |

(Evaluation of Resist Patterning: Evaluation Through NTD Process of Performing Development Using Organic Solvent)

The organic underlayer film (Layer A)-forming composition obtained above was applied onto a silicon wafer, and the applied organic underlayer film was baked on a hot plate at 240° C. for 60 seconds to obtain an organic underlayer film (Layer A) having a film thickness of 200 nm. Each of the Si-containing resist underlayer film (Layer B)-forming compositions obtained in Examples 11 to 18 and Comparative Examples 1 and 2 was applied onto Layer A, followed by baking on a hot plate at 240° C. for 60 seconds to obtain a Si-containing resist underlayer film (Layer B). The Si-containing resist underlayer films (Layers B) had a film thickness of 30 nm.

Onto each of Layers B, a commercially available photoresist solution (trade name: FAiRS-9521NT05, manufactured by FUJIFILM Corporation) was applied by a spinner, and heated on a hot plate at 100° C. for 1 minute to form a photoresist film (Layer C) having a film thickness of 85 nm.

Using a scanner, NSR-S307E, manufactured by Nikon Corporation (wavelength: 193 nm, NA, σ: 0.85, 0.93/0.85), each of the photoresist films was exposed through a mask that allows the formation of a 0.060-Gun line and space (L/S)=½ dense line, in which the line width and the width between the lines of the photoresist were each 0.060 μm after development, or through a mask that allows the formation of a 0.058-μm line and space (L/S)=1/1 dense line, in which the line width and the width between the lines of the photoresist were each 0.058 μm after development. Then, the photoresist film was baked on a hot plate at 100° C. for 60 seconds, and cooled down, then developed using butyl acetate (a solvent developer) for 60 seconds to form a negative-type pattern on the resist underlayer film (Layer B). In the obtained photoresist pattern, if any large pattern peeling, undercut, and line having a wider bottom (footing) were not observed, the pattern was evaluated as Good.

Table 4 shows refractive indexes at 193 nm, optical absorption coefficients, fluorine gas etching rates, oxygen-based gas resistance, and the observation results of the skirt shapes of resists after the lithography evaluation.

TABLE 5

| | Refractive index | Optical absorption coefficient | Fluorine-based gas etching rate (nm/min) | Oxygen-based gas resistance vs. organic underlayer film | Skirt shape of resist |
|---|---|---|---|---|---|
| Example 11 | 1.68 | 0.18 | 25 | 0.03 | Good |
| Example 12 | 1.68 | 0.18 | 25 | 0.03 | Good |
| Example 13 | 1.67 | 0.28 | 25 | 0.03 | Good |
| Example 14 | 1.67 | 0.28 | 25 | 0.03 | Good |
| Example 15 | 1.68 | 0.18 | 25 | 0.04 | Good |
| Example 16 | 1.68 | 0.18 | 25 | 0.04 | Good |
| Example 17 | 1.68 | 0.25 | 25 | 0.04 | Good |
| Example 18 | 1.68 | 0.25 | 25 | 0.04 | Good |
| Comparative Example 1 | 1.55 | 0.01 | 22 | 0.02 | Collapse |
| Comparative Example 2 | 1.55 | 0.01 | 22 | 0.02 | Collapse |

TABLE 6

| | Refractive index | Optical absorption coefficient | Fluorine-based gas etching rate (nm/min) | Oxygen-based gas resistance vs. organic underlayer film | Skirt shape of resist (negative-type development) |
|---|---|---|---|---|---|
| Example 19 | 1.72 | 0.23 | 25 | 0.03 | Good |
| Example 20 | 1.72 | 0.22 | 25 | 0.03 | Good |
| Example 21 | 1.71 | 0.21 | 25 | 0.03 | Good |
| Example 22 | 1.72 | 0.23 | 25 | 0.03 | Good |
| Example 23 | 1.72 | 0.21 | 25 | 0.03 | Good |
| Example 24 | 1.71 | 0.22 | 25 | 0.03 | Good |
| Example 25 | 1.72 | 0.21 | 25 | 0.03 | Good |
| Example 26 | 1.72 | 0.23 | 25 | 0.03 | Good |
| Example 27 | 1.72 | 0.21 | 25 | 0.03 | Good |
| Example 28 | 1.71 | 0.22 | 25 | 0.03 | Good |
| Example 29 | 1.72 | 0.21 | 25 | 0.03 | Good |
| Example 30 | 1.72 | 0.21 | 25 | 0.03 | Good |

[Resist Pattern Formation by EUV Exposure: Positive-Type Alkaline Development]

The organic underlayer film (Layer A)-forming composition was applied onto a silicon wafer, and the applied organic underlayer film was baked on a hot plate at 215° C. for 60 seconds to obtain an organic underlayer film (Layer A) having a film thickness of 90 nm. The organic underlayer film (Layer A) was spin-coated with each of the resist underlayer film-forming composition solutions prepared in Examples 1, 6, 8 and 10, and Comparative Example 1, and was heated at 215° C. for 1 minute to form a resist underlayer film (Layer B) (20 nm). The hard mask was spin-coated with a resist solution for EUV (a methacrylate resin-based resist) and heated to form an EUV resist layer (Layer C). The EUV resist layer (Layer C) was exposed to light using an EUV exposure apparatus (Micro Exposure Tool, abbreviated as MET) under the conditions of NA=0.30, σ=0.36/0.93, Quadropole. After the exposure, PEB was conducted, and then, the EUV resist layer was cooled to room temperature on a cooling plate, and developed for 60 seconds using an alkaline developer (a 2.38% TMAH aqueous solution), followed by a rinse treatment to form a resist pattern. Formation of a line-and-space pattern of 24 nm was evaluated, and the shape of the pattern was evaluated by observing the section of the pattern.

In Table 5, Good means a state in which a shape is intermediate between the footing shape and the undercut shape, and no significant amount of residues is present in a space portion; Collapse means an unfavorable state in which a resist pattern has peeled off and collapsed; and Bridge means an unfavorable state in which the top portions or bottom portions of a resist pattern are in contact with each other.

TABLE 7

| | Pattern shape |
|---|---|
| Example 1 | Good |
| Example 6 | Good |
| Example 8 | Good |
| Example 10 | Good |
| Example 31 | Good |
| Example 32 | Good |
| Comparative Example 1 | Bridge |

[Resist Pattern Formation by EUV Exposure: Negative-Type Solvent Development]

The organic underlayer film (Layer A)-forming composition was applied onto a silicon wafer, and the applied organic underlayer film was baked on a hot plate at 215° C. for 60 seconds to obtain an organic underlayer film (Layer A) having a film thickness of 90 nm. The organic underlayer film (Layer A) was spin-coated with each of the resist underlayer film-forming composition solutions prepared in Examples 1, 6, 8 and 10, and Comparative Example 1, and was heated at 215° C. for 1 minute to form a resist underlayer film (Layer B) (20 nm). The hard mask was spin-coated with a resist solution for EUV (a methacrylate resin-based resist) and heated to form an EUV resist layer (Layer C). The EUV resist layer (Layer C) was exposed to light using an EUV exposure apparatus (Micro Exposure Tool, abbreviated as MET) under the conditions of NA=0.30, σ=0.36/0.93, Quadropole. After the exposure, PEB was conducted, and then, the EUV resist layer was cooled to room temperature on a cooling plate, and developed for 60 seconds using butyl acetate (a solvent developer) to form a resist pattern. Formation of a line-and-space pattern of 24 nm was evaluated, and the shape of the pattern was evaluated by observing the section of the pattern.

In Table 6, Good means a state in which a shape is intermediate between the footing shape and the undercut shape, and no significant amount of residues is present in a space portion; Collapse means an unfavorable state in which a resist pattern has peeled off and collapsed; and Bridge means an unfavorable state in which the top portions or bottom portions of a resist pattern are in contact with each other.

TABLE 8

|  | Pattern shape |
| --- | --- |
| Example 1 | Good |
| Example 6 | Good |
| Example 8 | Good |
| Example 10 | Good |
| Example 17 | Good |
| Example 18 | Good |
| Comparative Example 1 | Collapse |
| Comparative Example 2 | Good |

[Evaluation of Film Thickness Changes after 1-Month Storage at 35° C.]

Spin-coating with each of solutions of the resist underlayer film-forming compositions of the present invention prepared in Examples 1, 6, 8, and 10 and Comparative Example 2 was performed, followed by heating at 215° C. for 1 minute to obtain a resist underlayer film layer. The film thickness of the resist underlayer film layer was measured. Furthermore, solutions of the resist underlayer film-forming compositions of the present invention prepared in Examples 1, 6, 8, and 10 and Comparative Example 2 were stored at 35° C. for 1 month, and then, spin-coating with each of the solutions was performed, followed by heating at 215° C. for 1 minute to obtain a resist underlayer film layer. The film thickness of the resist underlayer film layer was measured.

In Table 7, Good means that a film thickness measured after 1-month storage at 35° C. changed by 1 nm or less when compared with an initial film thickness, and Poor means that a film thickness measured after 1-month storage at 35° C. changed by 1 nm or more when compared with an initial film thickness.

TABLE 9

|  | Change in film thickness |
| --- | --- |
| Example 1 | Good |
| Example 6 | Good |
| Example 8 | Good |
| Example 10 | Good |
| Example 17 | Good |
| Example 18 | Good |
| Comparative Example 2 | Poor |

INDUSTRIAL APPLICABILITY

The present invention can be applied to, for example, resist underlayer film-forming compositions for ArF and KrF photoresists; resist underlayer film-forming compositions for EUV resists; upper layer film-forming compositions for EUV resists, resist underlayer film-forming compositions for electron beam resists; upper layer film-forming compositions for electron beam resists; and reverse material-forming compositions.

The invention claimed is:

1. A resist underlayer film-forming composition for lithography having an aliphatic polycyclic structure, the composition comprising, as a silane, a hydrolysis-condensation product of a hydrolyzable silane in which the aliphatic polycyclic structure is a structure which a hydrolyzable silane of Formula (1):

$$R^1_a R^2_b Si(R^3)_{4-(a+b)} \quad \text{Formula (1)}$$

where

R$^1$ is an organic group having an aliphatic polycyclic structure and bonded to a Si atom through a Si—C bond;

R$^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;

R$^3$ is an ethoxy group; a is an integer of 1; b is an integer of 0 to 2; and a+b is an integer of 1 to 3;

has, or a structure included in a compound added as an aliphatic polycyclic compound, an aliphatic polycyclic dicarboxylic acid, or an aliphatic polycyclic dicarboxylic acid anhydride, each optionally having a double bond, a hydroxy group, or an epoxy group, wherein when the aliphatic polycyclic structure is a structure which is the hydrolyzable silane of Formula (1), the hydrolyzable silane contains a combination of a first hydrolyzable silane (1-1) selected from the group consisting of tetraethoxysilane, tetramethoxysilane, methyltrialkoxysilane and phenyltrialkoxysilane, with a second hydrolyzable silane (1-2) selected from the group consisting of norbornene, norbornane, hetero atom-containing aliphatic polycyclic group, norbornene-containing aliphatic polycyclic group containing ester structure, norbornane-containing aliphatic polycyclic group containing ester structure, hetero atom-containing aliphatic polycyclic group containing ester structure, norbornene-containing aliphatic polycyclic group containing acid anhydride structure, norbornane-containing aliphatic polycyclic group containing acid anhydride structure, hetero atom-containing aliphatic polycyclic group containing acid anhydride structure, norbornene-containing aliphatic polycyclic group containing amide structure, norbornane-containing aliphatic polycyclic group containing amide structure, and hetero atom-containing aliphatic polycyclic group containing amide structure; and the hydrolysis-condensation product contains the following two unit structures:

2. The resist underlayer film-forming composition according to claim 1, wherein $R^1$ in Formula (1) is an optionally substituted norbornene, an optionally substituted norbornane, a cyclic aliphatic group containing a heteroatom, or an organic group comprising an optionally substituted norbornene, an optionally substituted norbornane, or a cyclic aliphatic group containing a heteroatom.

3. The resist underlayer film-forming composition according to claim 2, wherein a substituent of $R^1$ in Formula (1) is a carboxylic acid anhydride group, a carboxylic acid ester group, or an oxygen atom.

4. The resist underlayer film-forming composition according to claim 1, wherein the hydrolyzable silane is a combination of the hydrolyzable silane of Formula (1) and another hydrolyzable silane, the other hydrolyzable silane being at least one hydrolyzable silane selected from the group consisting of a hydrolyzable silane of Formula (2):

$$R^4{}_c Si(R^5)_{4-c} \quad \text{Formula (2)}$$

where
$R^4$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond;
$R^5$ is an alkoxy group, an acyloxy group, or a halogen group; and
c is an integer of 0 to 3; and a hydrolyzable silane of Formula (3):

$$[R^6{}_d Si(R^7)_{3-d}]_2 Y_e \quad \text{Formula (3)}$$

where
$R^6$ is an alkyl group and bonded to a silicon atom through a Si—C bond;
$R^7$ is an alkoxy group, an acyloxy group, or a halogen group;
Y is an alkylene group or an arylene group;
d is an integer of 0 or 1; and
e is an integer of 0 or 1.

5. The resist underlayer film-forming composition according to claim 1, further comprising an acid as a hydrolysis catalyst.

6. The resist underlayer film-forming composition according to claim 1, further comprising water.

7. The resist underlayer film-forming composition according to claim 1, further comprising they hydrolyzable silane and/or a hydrolysis product of the hydrolyzable silane.

8. A resist underlayer film-forming composition comprising, as a polymer, a hydrolysis-condensation product of a hydrolyzable silane formed of a combination of a hydrolyzable silane of Formula (1):

$$R^1{}_a R^2{}_b Si(R^3)_{4-(a+b)} \quad \text{Formula (1)}$$

where
$R^1$ is an organic group having an aliphatic polycyclic structure and bonded to a Si atom through a Si—C bond;
$R^2$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, an amino group, or a cyano group, and is bonded to a silicon atom through a Si—C bond;
$R^3$ is an ethoxy group; a is an integer of 1;
b is an integer of 0 to 2; and
a+b is an integer of 1 to 3; wherein
the hydrolyzable silane contains a combination of
a first hydrolyzable silane (1-1) selected from the group consisting of tetraethoxysilane, tetramethoxysilane, methyltrialkoxysilane and phenyltrialkoxysilane, with a second hydrolyzable silane (1-2) selected from the group consisting of norbornene, norbornane, hetero atom-containing aliphatic polycyclic group, norbornene-containing aliphatic polycyclic group containing ester structure, norbornane-containing aliphatic polycyclic group containing ester structure, hetero atom-containing aliphatic polycyclic group containing ester structure, norbornene-containing aliphatic polycyclic group containing acid anhydride structure, norbornane-containing aliphatic polycyclic group containing acid anhydride structure, hetero atom-containing aliphatic polycyclic group containing acid anhydride structure, norbornene-containing aliphatic polycyclic group containing amide structure, norbornane-containing aliphatic polycyclic group containing amide structure, and hetero atom-containing aliphatic polycyclic group containing amide structure; and the hydrolysis-condensation product contains the following two unit structures:

and a hydrolyzable silane of Formula (2):

$$R^4{}_c Si(R^5)_{4-c} \quad \text{Formula (2)}$$

where
$R^4$ is an alkyl group, an aryl group, a halogenated alkyl group, a halogenated aryl group, an alkoxyaryl group, an alkenyl group, or an organic group having an epoxy group, an acryloyl group, a methacryloyl group, a mercapto group, or a cyano group, and is bonded to a silicon atom through a Si—C bond;
$R^5$ is an alkoxy group, an acyloxy group, or a halogen group; and
c is an integer of 0 to 3.

9. A resist underlayer film obtained by applying the resist underlayer film-forming composition as claimed in claim 1 onto a semiconductor substrate and baking the applied resist underlayer film-forming composition.

10. A method for manufacturing a semiconductor device, the method comprising the steps of:
applying the resist underlayer film-forming composition as claimed in claim 1 onto a semiconductor substrate, and baking to form a resist underlayer film;
applying a resist composition onto the underlayer film to form a resist film;
exposing the resist film to light;
developing the resist film after the exposure to obtain a resist pattern;
etching the resist underlayer film using the resist pattern; and
processing the semiconductor substrate using the patterned resist and the patterned resist underlayer film.

11. A method for manufacturing a semiconductor device, the method comprising the steps of:
forming an organic underlayer film on a semiconductor substrate;
applying the resist underlayer film-forming composition as claimed in claim 1 onto the organic underlayer film, and baking the composition to form a resist underlayer film;
applying a resist composition onto the resist underlayer film to form a resist film;
exposing the resist film to light;
developing the resist film after the exposure to obtain a resist pattern; etching the resist underlayer film using the resist pattern;
etching the organic underlayer film using the patterned resist underlayer film; and
processing the semiconductor substrate using the patterned organic underlayer film.

* * * * *